US012772694B2

(12) United States Patent
Lee et al.

(10) Patent No.: US 12,772,694 B2
(45) Date of Patent: Oct. 20, 2026

(54) LIGHT EMITTING DISPLAY DEVICE

(71) Applicant: LG Display Co., Ltd., Seoul (KR)

(72) Inventors: Joonsuk Lee, Paju-si (KR); SeJune Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 996 days.

(21) Appl. No.: 17/939,240

(22) Filed: Sep. 7, 2022

(65) Prior Publication Data

US 2023/0077299 A1 Mar. 9, 2023

(30) Foreign Application Priority Data

Sep. 9, 2021 (KR) ........................ 10-2021-0120476

(51) Int. Cl.
*H10K 59/80* (2023.01)
*H10K 59/131* (2023.01)

(52) U.S. Cl.
CPC ... *H10K 59/80522* (2023.02); *H10K 59/1315* (2023.02)

(58) Field of Classification Search
CPC ........... H10K 50/824; H10K 59/80522; H10K 59/1315
See application file for complete search history.

(56) References Cited

U.S. PATENT DOCUMENTS 10,692,947 B2 * 6/2020 Kim ..................... H10K 59/123
2012/0223342 A1 * 9/2012 Tanada ................... H10K 59/86 257/40
2014/0103385 A1 4/2014 Hatano et al.
2015/0179718 A1 * 6/2015 Kim ..................... H10K 59/122 438/34
2015/0179719 A1 * 6/2015 Nam .................... H10K 59/124 438/4
2016/0149156 A1 5/2016 Kim et al.
(Continued)

FOREIGN PATENT DOCUMENTS

CN 102655220 A 9/2012
CN 103779470 A 5/2014
(Continued)

OTHER PUBLICATIONS

Office Action dated Sep. 5, 2024, issued in corresponding German Patent Application No. 10 2022 120 273.9.
(Continued)

*Primary Examiner* — Bumsuk Won
(74) *Attorney, Agent, or Firm* — Morgan, Lewis & Bockius LLP

(57) ABSTRACT

Disclosed is a light emitting display device including a circuit layer having a thin film transistor and an auxiliary power electrode over a substrate, a protective layer overlaying the circuit layer, a contact portion configured to expose a portion of the auxiliary power electrode, an eaves structure disposed over a portion of the auxiliary power electrode and configured to have an undercut region, a pixel electrode disposed over the protective layer and connected to the thin film transistor, a light emitting layer disposed over the pixel electrode, and a common electrode disposed over the light emitting layer and connected to the auxiliary power electrode in the undercut region of the eaves structure, wherein the eaves structure is made of a single material.

20 Claims, 14 Drawing Sheets

(56) References Cited

U.S. PATENT DOCUMENTS

| | | | | |
|---|---|---|---|---|
| 2016/0293888 | A1* | 10/2016 | Shim | H10K 59/1315 |
| 2017/0033166 | A1 | 2/2017 | Shim et al. | |
| 2018/0062109 | A1* | 3/2018 | Kim | H10K 59/80522 |
| 2018/0123088 | A1 | 5/2018 | Kim et al. | |
| 2019/0140038 | A1 | 5/2019 | Lee et al. | |
| 2021/0202889 | A1* | 7/2021 | Lee | H10K 50/16 |

FOREIGN PATENT DOCUMENTS

| | | | |
|---|---|---|---|
| CN | 105633297 | A | 6/2016 |
| CN | 106409870 | A | 2/2017 |
| CN | 113130560 | A | 7/2021 |
| EP | 3 846 220 | A1 | 7/2021 |
| KR | 10-2015-0067974 | A | 6/2015 |
| KR | 10-2015-0075017 | A | 7/2015 |
| KR | 10-2016-0079523 | A | 7/2016 |
| KR | 10-2018-0047535 | A | 5/2018 |
| KR | 20180068549 | A | 6/2018 |
| KR | 10-2019-0051686 | A | 5/2019 |
| KR | 20200076278 | A | 6/2020 |

OTHER PUBLICATIONS

Office Action issued in corresponding Chinese Patent Application No. 202210829930.2, dated May 28, 2025.

Office Action dated Jun. 13, 2025 issued in corresponding Korean Patent Application No. 10-2021-0120476.

* cited by examiner

LIGHT EMITTING DISPLAY DEVICE

BACKGROUND

Technical Field

The present disclosure relates to a light emitting display device.

Discussion of the Related Art

With the advancement of an information-oriented society, attentions and requirements for a display device configured to display information have been increased in various types.

Among these display devices, a light emitting display device is classified into an inorganic light emitting display device and an organic light emitting display device according to a material of a light emitting layer. For example, the organic light emitting display device is a self-luminance display device, wherein the organic light emitting display device may display an image by injecting holes and electrons into the light emitting layer, respectively, from an anode electrode for injecting holes and a cathode electrode for injecting electrons, and emitting light when an exciton in which the injected holes and electrons are combined falls from an excited state to a base state.

The light emitting display device may be divided into a top emission type, a bottom emission type, or a dual emission type according to a direction in which light is emitted.

In the case of the light emitting display device of the top emission type, an electrode having the transparent characteristic or an electrode having the semi-transmissive characteristic may be used as a cathode to emit light emitted from the light emitting layer to the top. The cathode electrode has a thin thickness to improve transmittance, whereby an electrical resistance increases. Especially, in the case of a large-sized light emitting display device, a voltage drop is more severely generated according as a distance from a voltage supply pad portion increases, so that a problem related with brightness non-uniformity of the light emitting display device may be generated.

In order to solve the voltage drop caused by the increase in resistance of the cathode electrode, a cathode contact structure having an undercut shape is proposed to electrically connect a separate auxiliary electrode to the cathode electrode.

However, in the case of the cathode contact structure, different material layers are formed in a stacked structure, and the undercut shape is formed through selective etching, whereby a step difference is generated at the interface between the different material layers, or a separation phenomenon is frequently generated, thereby reducing a mass production of the light emitting display device.

The above content of the background technology may be retained for a deduction of the present disclosure by inventors, or may be technology information learned by practice of embodiments of the present disclosure. However, the above content of the background technology may be not a prior art published to the general public before an application of the present disclosure.

SUMMARY

Accordingly, embodiments of the present disclosure are directed to a light emitting display device that substantially obviates one or more of the problems due to limitations and disadvantages of the related art.

An aspect of the present disclosure is to provide a light emitting display device capable of forming an undercut shape of a high peel resistance in a cathode contact region, and thus reducing defects occurring in a manufacturing process and improving productivity.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display device comprises a circuit layer having a thin film transistor and an auxiliary power electrode over a substrate, a protective layer overlaying the circuit layer, a contact portion configured to expose a portion of the auxiliary power electrode, an eaves structure disposed over a portion of the auxiliary power electrode and configured to have an undercut region, a pixel electrode disposed over the protective layer and connected to the thin film transistor, a light emitting layer disposed over the pixel electrode, and a common electrode disposed over the light emitting layer and connected to the auxiliary power electrode in the undercut region of the eaves structure, wherein the eaves structure is made of a single material.

In another aspect, a light emitting display device comprises a circuit layer having a thin film transistor and an auxiliary power electrode over a substrate, a first protective layer overlaying the circuit layer, a second protective layer disposed over the first protective layer, a pixel electrode disposed over the second protective layer and connected to the thin film transistor, a bank layer disposed over the second protective layer and configured to define an opening at the pixel electrode, a contact portion which penetrates the first and second protective layers and the bank layer to expose a portion of the auxiliary power electrode, an eaves structure disposed over a portion of the auxiliary power electrode exposed by the contact portion and configured to include an undercut region, a light emitting layer disposed over the pixel electrode and the bank layer, and a common electrode disposed over the light emitting layer and connected to the auxiliary power electrode in the undercut region of the eaves structure.

In another aspect, a light emitting display device comprises a circuit layer having a thin film transistor and an auxiliary power electrode over a substrate, a first protective layer overlaying the circuit layer, a second protective layer disposed over the first protective layer, a contact portion configured to expose a portion of the auxiliary power electrode, an eaves structure disposed over a portion of the auxiliary power electrode and configured to have an undercut region, a support pattern between a portion of the auxiliary power electrode and the eaves structure, a pixel electrode disposed over the second protective layer and connected to the thin film transistor, a light emitting layer disposed over the pixel electrode, and a common electrode disposed over the light emitting layer and connected to the auxiliary power electrode in the undercut region of the eaves structure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles. In the drawings.

DETAILED DESCRIPTION

Figure 1:
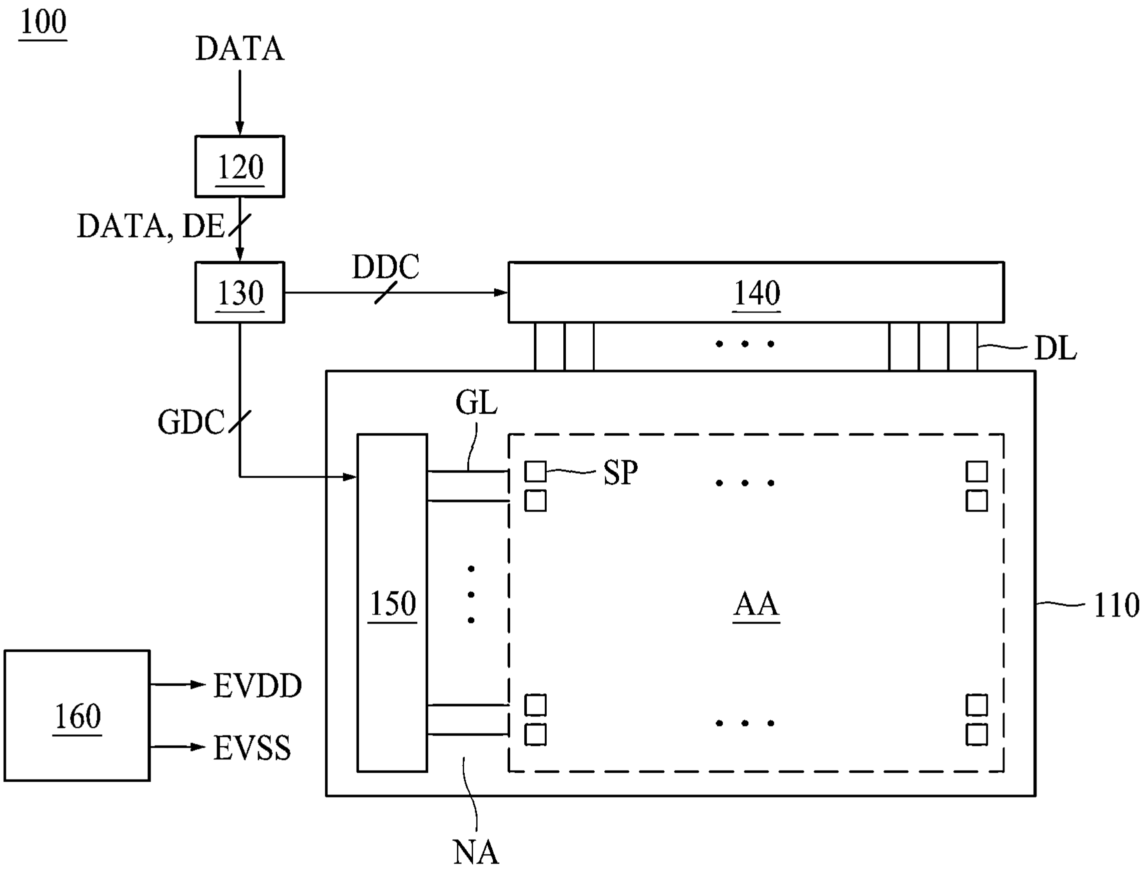
FIG. 1 is a block diagram schematically illustrating a light emitting display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a temporal relationship, for example, when the temporal order is described as "after," "subsequent," "next," and "before," a case which is not continuous may be included, unless "just" or "direct" is used.

It will be understood that, although the terms "first", "second", etc. may be used herein to describe various elements, these elements should not be limited by these terms. These terms are only used to partition one element from another. For example, a first element could be termed a second element, and, similarly, a second element could be termed a first element, without departing from the scope of the present invention.

The terms "first horizontal axis direction," "second horizontal axis direction," and "vertical axis direction" should not be interpreted only based on a geometrical relationship in which the respective directions are perpendicular to each other, and may be meant as directions having wider directivities within the range within which the components of the present disclosure can operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a preferred embodiment of a light emitting display device according to the present disclosure will be described in detail with reference to the accompanying drawings. Wherever possible, the same reference numbers will be used throughout the drawings to refer to the same or like parts. Since a scale of each of elements shown in the accompanying drawings is different from an actual scale for convenience of description, the present disclosure is not limited to the shown scale.

FIG. 1 is a block diagram schematically illustrating a light emitting display device according to one embodiment of the present disclosure.

Referring to FIG. 1, the light emitting display device 100 according to one embodiment of the present disclosure may include a display panel 110, an image processor 120, a timing controller 130, a data driver 140, a scan driver 150, and a power supply 160.

The display panel 110 may display an image corresponding to a data signal DATA supplied from the data driver 140, a scan signal supplied from the scan driver 150, and power supplied from the power supply 160.

The display panel 110 may include a sub pixel SP disposed at every intersection of a plurality of gate lines GL and a plurality of data lines DL. A structure of the sub pixel SP may vary depending on the type of the display device 100.

For example, the sub pixels SP may be formed in a top emission method, a bottom emission method, or a dual emission method according to the structure. The sub pixels SP may include a red sub pixel, a green sub pixel, and a blue sub pixel. Alternatively, the sub pixel SP may include a red sub pixel, a blue sub pixel, a white sub pixel, and a green sub pixel. The sub pixels SP may have one or more other light emitting areas according to light emitting characteristics.

The one or more sub pixels SP may constitute one unit pixel. For example, one unit pixel may include red, green, and blue sub pixels, and the red, green, and blue sub pixels may be repeatedly arranged. Alternatively, one unit pixel may include red, green, blue, and white subpixels, wherein the red, green, blue and white subpixels may be repeatedly arranged, or the red, green, blue and white subpixels may be arranged in a quad type. In the embodiment according to the present disclosure, the color type, arrangement type, arrangement order, etc. of the sub pixels may be configured in various forms depending on the luminous characteristics, the lifespan of the device, the spec of the device, and the like, whereby it is not limited thereto.

The display panel 110 may be divided into a display area AA for displaying an image by arranging the sub pixels SP, and a non-display area NA around the display area AA. The scan driver 150 may be provided on the non-display area NA of the display panel 110. In addition, the non-display area NA may include a pad area.

The image processor 120 may output a data enable signal DE together with the data signal DATA supplied from the outside. The image processor 120 may output one or more of a vertical synchronization signal, a horizontal synchronization signal, and a clock signal in addition to the data enable signal DE.

The timing controller 130 may receive the data signal DATA as well as a driving signal from the image processor 120. The driving signal may include the data enable signal DE. Alternatively, the driving signal may include a vertical synchronization signal, a horizontal synchronization signal, and a clock signal. The timing controller 130 may output a data timing control signal DDC for controlling the operation timing of the data driver 140, and a gate timing control signal GDC for controlling the operation timing of the scan driver 150 based on the driving signal.

The data driver 140 may convert the data signal DATA into a gamma reference voltage by sampling and latching the data signal DATA supplied from the timing controller 130 in response to the data timing control signal DDC supplied from the timing controller 130, and may output the gamma reference voltage.

The data driver 140 may output the data signal DATA through the data lines DL. The data driver 140 may be implemented in the form of an integrated circuit IC. For example, the data driver 140 may be electrically connected to the pad area disposed in the non-display area NA of the display panel 110 through a flexible circuit film.

The scan driver 150 may output the scan signal in response to the gate timing control signal GDC supplied from the timing controller 130. The scan driver 150 may output the scan signal through the gate lines GL. The scan driver 150 may be implemented in the form of an integrated circuit IC or may be implemented in a gate-in-panel GIP scheme.

The power supply 160 may output a high potential voltage and a low potential voltage for driving the display panel 110. The power supply 160 may supply the high potential voltage to the display panel 110 through a first power line EVDD (or driving power line), and may supply the low potential voltage to the display panel 110 through a second power line EVSS (or auxiliary power line).

Figure 2:
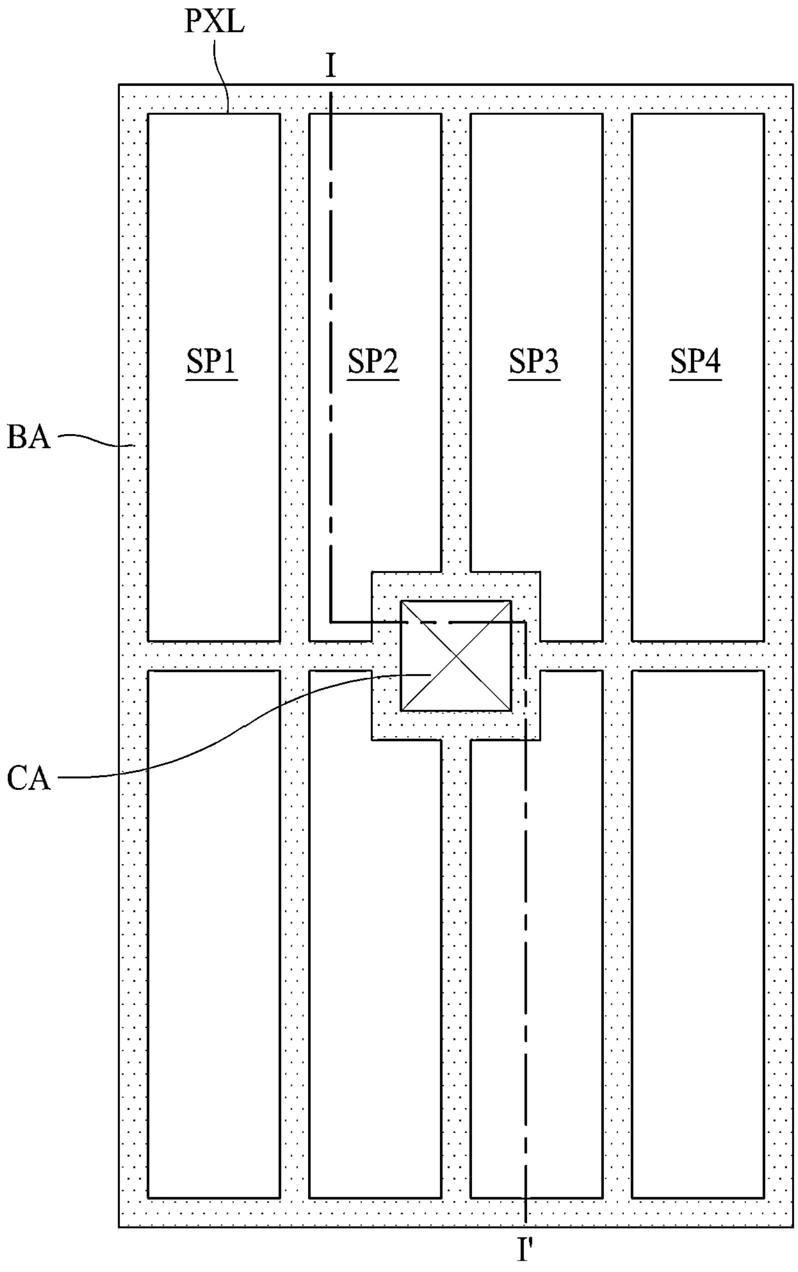
FIG. 2 is a plan view schematically illustrating a first electrode, a bank layer, and a contact portion of sub pixels in the light emitting display device according to the embodiment of the present disclosure.

FIG. 2 is a plan view schematically illustrating a first electrode, a bank layer, and a contact portion of sub pixels in the light emitting display device according to the embodiment of the present disclosure.

Referring to FIG. 2 in connection with FIG. 1, the display panel 110 of the light emitting display device 100 according to the embodiment of the present disclosure may be divided into the display area AA and the non-display area NA, and may include the plurality of sub pixels SP1, SP2, SP3, and SP4 defined by the intersection between the gate line GL and the data line DL on the substrate of the display area AA.

As shown in FIG. 2, the plurality of sub pixels SP1, SP2, SP3, and SP4 may include the first sub pixel SP1, the second sub pixel SP2, the third sub pixel SP3, and the fourth sub pixel SP4. For example, the first sub pixel SP1 may emit red light, the second sub pixel SP2 may emit green light, the third sub pixel SP3 may emit blue light, and the fourth sub pixel SP4 may emit white light, but not necessarily. It is possible to omit the fourth sub pixel SP4 for emitting white light. It is possible to configure the sub pixels emitting at least two of red light, green light, blue light, yellow light, magenta light, and cyan light. Also, the arrangement order of the sub pixels SP1, SP2, SP3, and SP4 may be variously changed.

A pixel electrode PXL (eg, anode electrode or first electrode) may be disposed in each of the plurality of sub pixels SP1, SP2, SP3, and SP4. A bank layer BA covering (or overlaying) an edge portion of the pixel electrode PXL and defining an opening corresponding to the plurality of sub pixels SP1, SP2, SP3, and SP4 may be disposed on the pixel electrode PXL. Then, a light emitting layer (eg, organic light emitting layer) and a common electrode (eg, cathode electrode or second electrode) may be sequentially stacked on the pixel electrode PXL and the bank layer BA.

According to the embodiment of the present disclosure, in order to lower the resistance of the common electrode provided over the entire surface of the display panel 110, a separate auxiliary power electrode may be formed of a material having a lower resistance than the common electrode and electrically connected to the common electrode. The bank layer BA may define a contact portion CA that exposes a portion of the auxiliary power electrode so as to electrically connect the auxiliary power electrode and the common electrode with each other.

The contact portion CA may be formed for each of the four sub pixels SP1, SP2, SP3, and SP4 constituting one unit pixel while being parallel to the gate line GL, however, it is not limited to this structure. The contact portion CA may be formed every several sub pixels. In addition, the contact portion CA may be formed by each horizontal line in a direction parallel to the data line DL, but is not limited thereto, and may be formed every several horizontal lines.

First Embodiment

Figure 3:
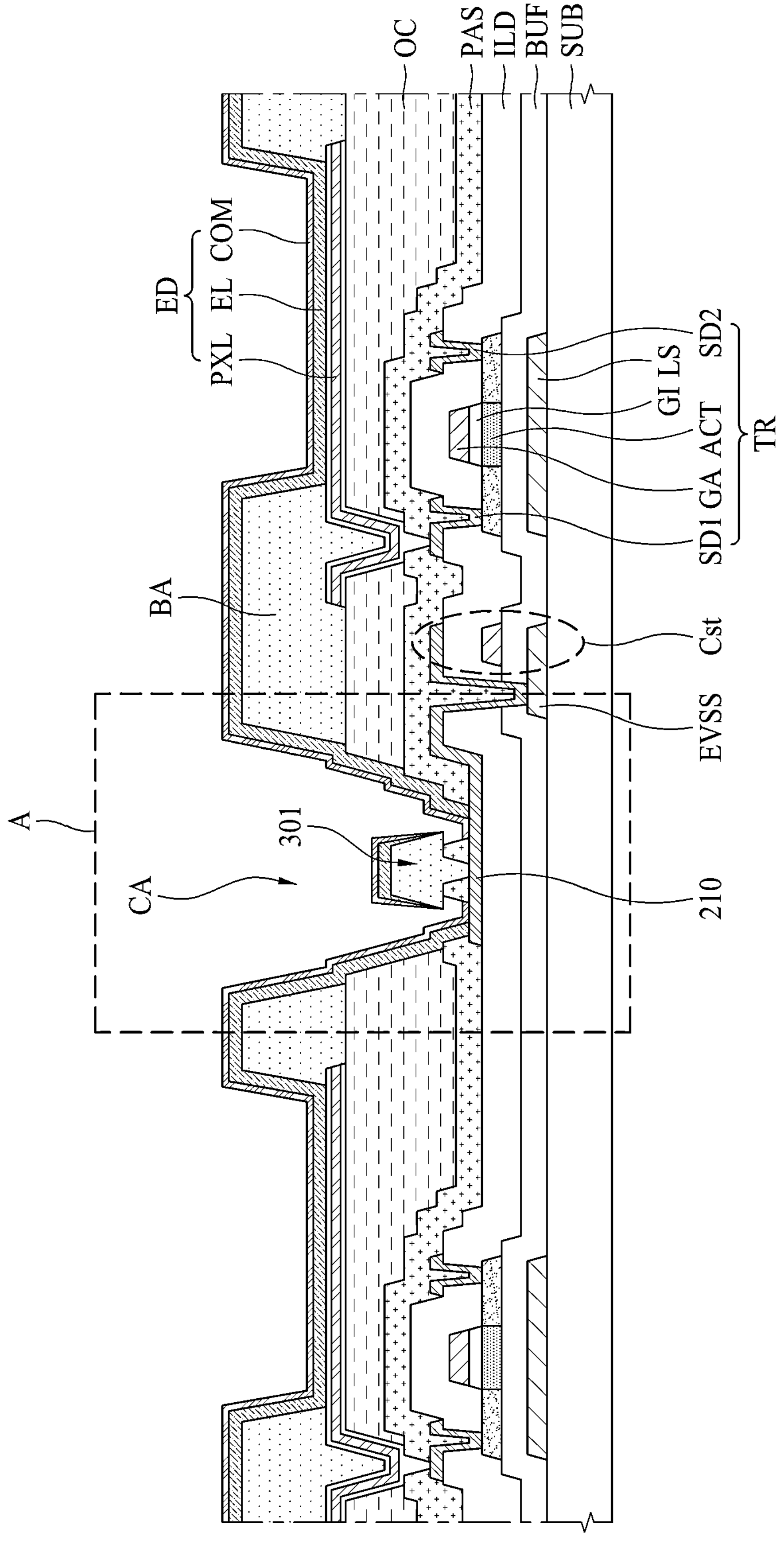
FIG. 3 is a cross sectional view along I-I' of FIG. 2 according to the first embodiment of the present disclosure.
Figure 4:
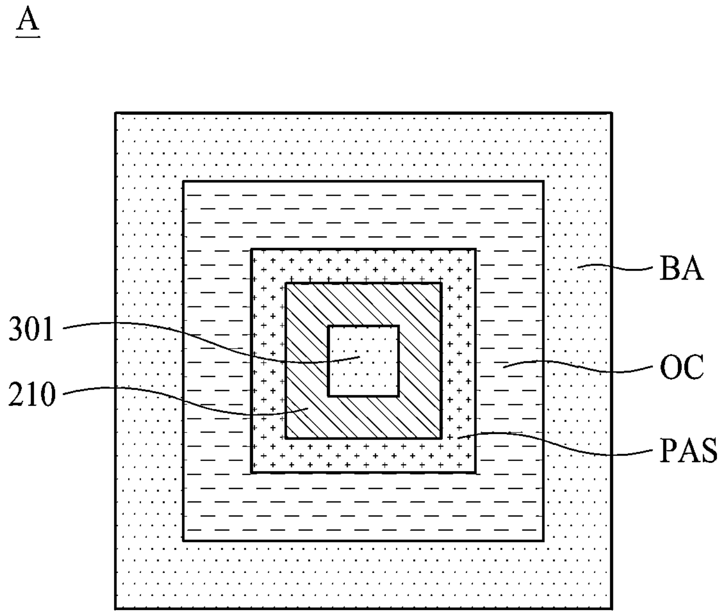
FIG. 4 is a plan view illustrating a contact portion of 'A' portion in FIG. 3 according to the first embodiment of the present disclosure.
Figure 5:
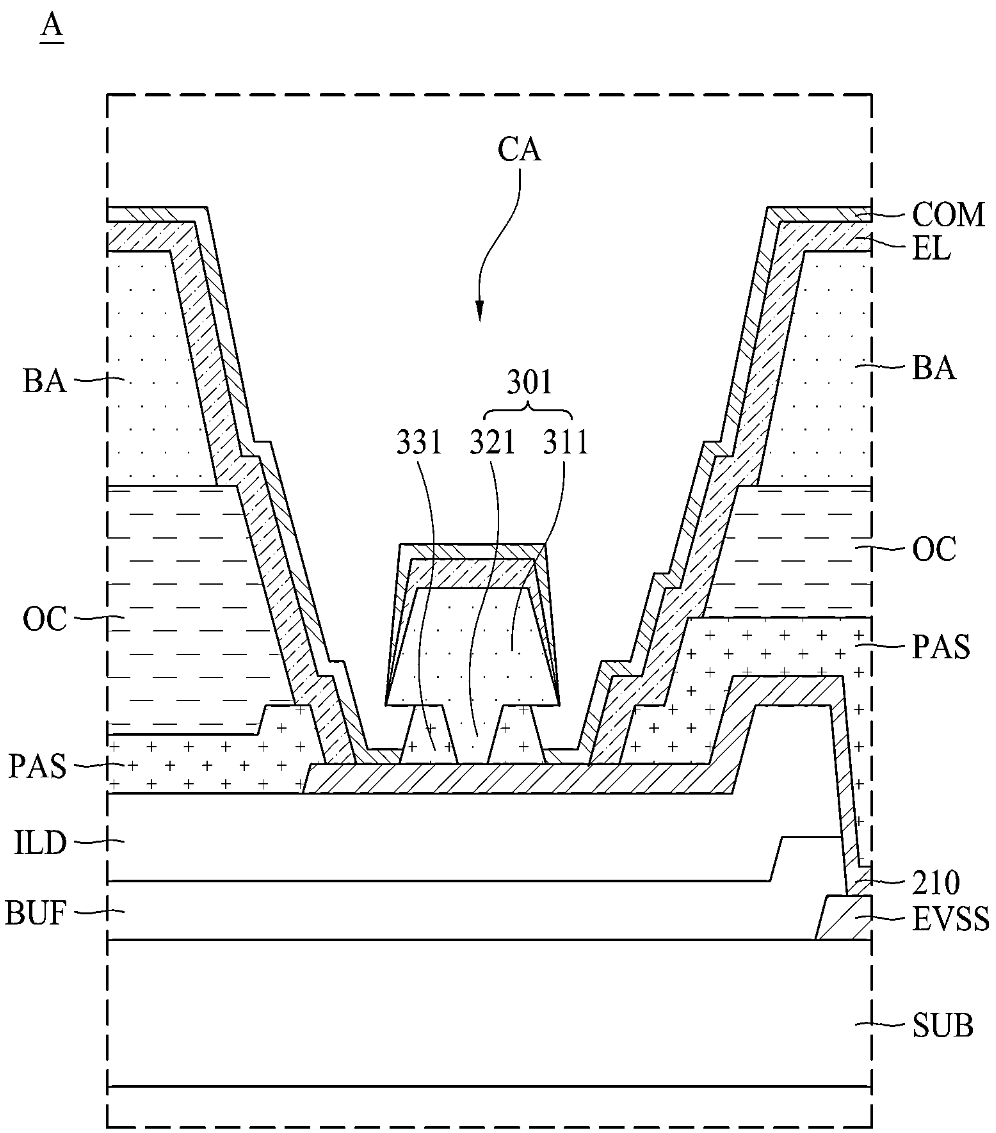
FIG. 5 is a cross sectional view illustrating one example of a contact portion of 'A' portion in FIG. 3 according to the first embodiment of the present disclosure.
Figure 6:
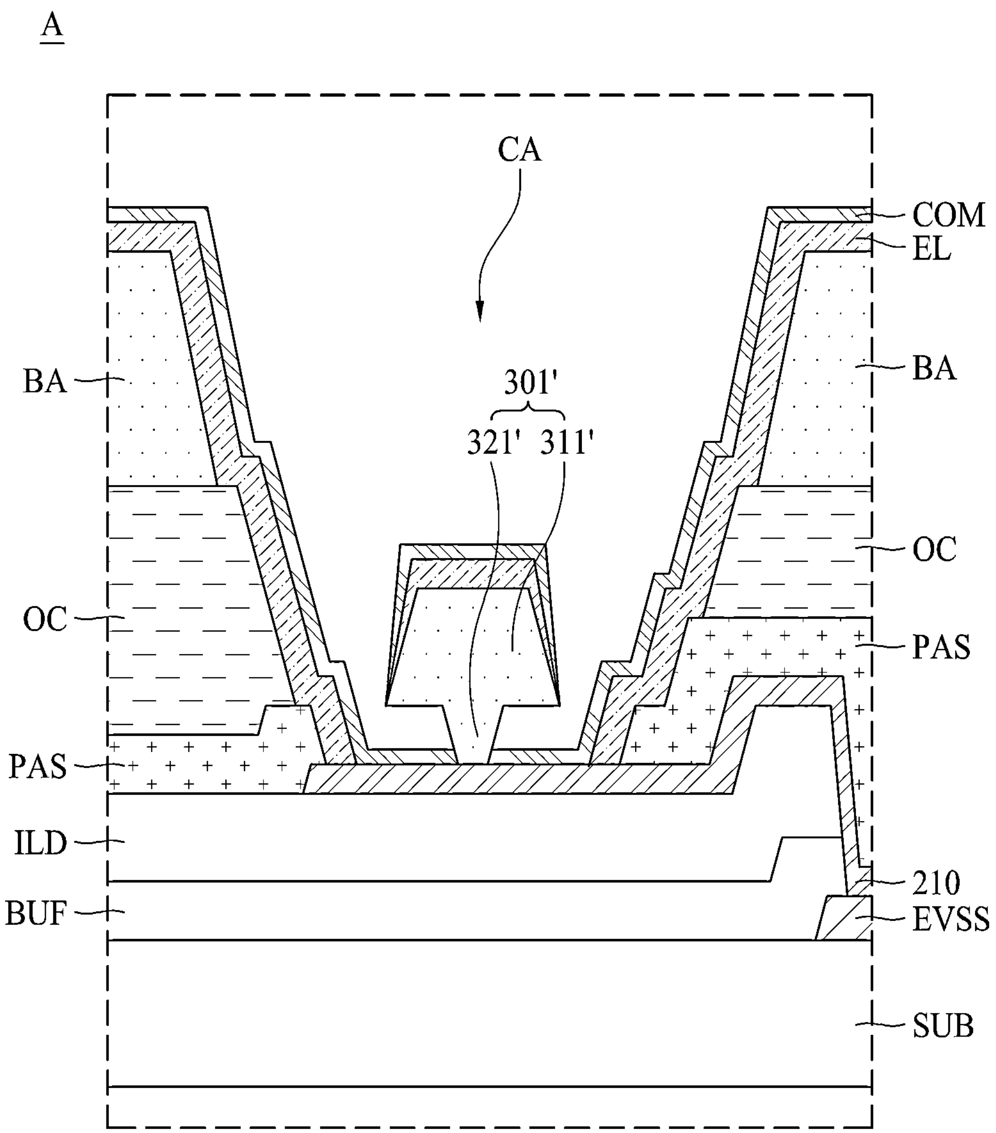
FIG. 6 is a cross sectional view illustrating another example of a contact portion of 'A' portion in FIG. 3 according to the first embodiment of the present disclosure.

FIG. 3 is a cross sectional view along I-I' of FIG. 2 according to the first embodiment of the present disclosure, FIG. 4 is a plan view illustrating a contact portion of 'A' portion in FIG. 3 according to the first embodiment of the present disclosure, FIG. 5 is a cross sectional view illustrating one example of a contact portion of 'A' portion in FIG. 3 according to the first embodiment of the present disclosure, and FIG. 6 is a cross sectional view illustrating another example of a contact portion of 'A' portion in FIG. 3 according to the first embodiment of the present disclosure.

Referring to FIGS. 3 and 4, the light emitting display device according to the first embodiment of the present disclosure may include a substrate SUB, a light shielding layer LS, an auxiliary power line EVSS (or second power line), a buffer layer BUF, a thin film transistor TR, a storage capacitor Cst, a gate insulating film GI, an insulating interlayer ILD, an auxiliary power electrode 210, a passivation layer PAS (or first protective layer), an overcoat layer OC (or second protective layer), a light emitting device ED, a bank layer BA, a contact portion CA, and an eaves structure 301.

The substrate SUB may be a base substrate, and may be made of a glass or plastic material. For example, the substrate SUB may be formed of a plastic material such as polyimide (PI), polyethylene terephthalate (PET), polyethylene naphthalate (PEN), polycarbonate (PC), etc., and may have a flexible property.

On the substrate SUB, a circuit device including various signal lines, the thin film transistor TR, and the storage capacitor Cst may be provided for each of a plurality of sub pixels SP1, SP2, SP3, and SP4. The signal lines may include a gate line GL, a data line DL, a power line, and a reference line, and the thin film transistor TR may include a driving thin film transistor, a switching thin film transistor, a sensing thin film transistor, etc.

The light shielding layer LS and the auxiliary power line EVSS (or second power line) may be disposed on the substrate SUB. The light shielding layer LS may be disposed to overlap the thin film transistor TR. For example, the light shielding layer LS may overlap an active layer ACT of the thin film transistor TR. In particular, the light shielding layer LS may be disposed so as to overlap a channel region of the active layer ACT. The light shielding layer LS may serve to block external light from entering the active layer ACT. In addition, the auxiliary power line EVSS (eg, second power line or low potential power line) may serve to apply a low voltage to a common electrode COM (eg, cathode electrode or second electrode). In addition, the auxiliary power line EVSS may serve to lower a resistance of the common electrode COM together with the auxiliary power electrode 210.

The light shielding layer LS and the auxiliary power line EVSS may be formed of the same material in the same layer. In this case, the light shielding layer LS and the auxiliary power line EVSS may be simultaneously formed through the same process.

The buffer layer BUF may be disposed on the substrate SUB to cover (or overlay) the light shielding layer LS and the auxiliary power line EVSS. The buffer layer BUF may be formed by stacking a single inorganic layer or a plurality of inorganic layers. For example, the buffer layer BUF may be formed of a single layer composed of a silicon oxide layer SiOx, a silicon nitride layer SiN, and a silicon oxynitride layer SiON. Alternatively, the buffer layer BUF may be formed of a multi-layer in which at least two layers of a silicon oxide layer SiOx, a silicon nitride layer SiN, and a silicon oxynitride layer SiON are stacked. The buffer layer BUF may be formed on the entire upper surface of the substrate SUB in order to block ions or impurities diffused from the substrate SUB and to prevent moisture from being permeated into the light emitting device ED through the substrate SUB.

The thin film transistor TR, the storage capacitor Cst, and the auxiliary power electrode 210 may be disposed on the buffer layer BUF. The thin film transistor TR may be disposed on each of the plurality of sub pixels SP1, SP2, SP3, and SP4 on the buffer layer BUF. For example, the thin film transistor TR may include the active layer ACT, a gate electrode GA overlapping the active layer ACT with the gate insulating film GI interposed therebetween, a first source/drain electrode SD1, and a second source/drain electrode SD2. Also, the storage capacitor Cst may be formed in a triple structure in which a first capacitor electrode using some or entire portions of the light shielding layer LS or auxiliary power line EVSS, a second capacitor electrode which is patterned by the same metal material as the gate electrode GA of the thin film transistor TR, and a third capacitor electrode using some or entire portions of the auxiliary power electrode 210 are overlapped, but not necessarily. If needed, the storage capacitor Cst may be formed in a multi-layered structure implemented by various plural layers. The auxiliary power electrode 210 may be electrically connected to the auxiliary power line EVSS through a contact hole penetrating the buffer layer BUF and the insulating interlayer ILD.

The active layer ACT of the thin film transistor TR may be made of a silicon-based or oxide-based semiconductor material and may be formed on the buffer layer BUF. The active layer ACT may include a channel region overlapping the gate electrode GA, and a source/drain region connected to the first and second source/drain electrodes SD1 and SD2.

The gate insulating film GI may be formed on the active layer ACT. The gate insulating film GI may be disposed on the channel region of the active layer ACT and may insulate the active layer ACT and the gate electrode GA from each other. The gate insulating film GI may be made of an inorganic insulating material, for example, a silicon oxide layer SiOx, a silicon nitride layer SiN, a silicon oxynitride layer SiON, or a multi-layer thereof.

The gate electrode GA may be formed on the gate insulating film GI. The gate electrode GA may confront the active layer ACT with the gate insulating film GI interposed in-between. The gate electrode GA may be formed of any one or multiple layers selected from the group consisting of copper (Cu), molybdenum (Mo), aluminum (Al), chromium (Cr), gold (Au), titanium (Ti), nickel (Ni), neodymium (Nd), tantalum (Ta), or tungsten (W). Also, the second capacitor electrode forming a portion of the storage capacitor Cst may be formed of the same material as the gate electrode GA on the buffer layer BUF. In this case, the gate electrode GA of the thin film transistor TR and the second capacitor electrode of the storage capacitor Cst may be formed at the same time through the same process.

The insulating interlayer ILD covering the gate electrode GA may be formed on the buffer layer BUF. Also, the insulating interlayer ILD may be formed to cover the second capacitor electrode of the storage capacitor Cst. The insulating interlayer ILD may protect the thin film transistor TR. The insulating interlayer ILD may be formed of an inorganic insulating material. For example, the insulating interlayer ILD may be formed of a silicon oxide layer SiOx, a silicon nitride layer SiN, a silicon oxynitride layer SiON, or a multi-layer thereof.

The first and second source/drain electrodes SD1 and SD2 may be formed on the insulating interlayer ILD. The insulating interlayer ILD may be partially removed to contact the active layer ACT and the first and second source/drain electrodes SD1 and SD2. For example, the first and second source/drain electrodes SD1 and SD2 may be electrically connected to the active layer ACT through the contact hole passing through the insulating interlayer ILD.

The auxiliary power electrode 210 may be formed on the insulating interlayer ILD. In order to contact the auxiliary power line EVSS and the auxiliary power electrode 210, corresponding regions of the insulating interlayer ILD and the buffer layer BUF therebelow may be removed to contact the auxiliary power line EVSS and the auxiliary power electrode 210. For example, the auxiliary power electrode 210 may be electrically connected to the auxiliary power line EVSS through the contact hole penetrating the insulating interlayer ILD and the buffer layer BUF. Also, the auxiliary power electrode 210 may serve as the third capacitor electrode of the storage capacitor Cst.

The first and second source/drain electrodes SD1 and SD2 and the auxiliary power electrode 210 may be formed of the same material in the same layer. The first and second source/drain electrodes SD1 and SD2 and the auxiliary power electrode 210 may be simultaneously formed through the same process. The first and second source/drain electrodes SD1 and SD2 and the auxiliary power electrode 210 may be provided in a single-layered or multiple-layered structure. When each of the first and second source/drain electrodes SD1 and SD2 and the auxiliary power electrode 210 is formed in the single-layered structure, it may be formed of one or more selected from the group consisting of molybdenum (Mo), aluminum (Al), chromium (Cr), gold (Au), titanium (Ti), nickel (Ni), neodymium (Nd), or copper (Cu). When each of the first and second source/drain electrodes SD1 and SD2 and the auxiliary power electrode 210 is formed in the multi-layered structure, a double layer of molybdenum/aluminum-neodymium, molybdenum/aluminum, titanium/aluminum, or copper/molybdenum titanium may be used. Alternatively, the first and second source/drain electrodes SD1 and SD2 and the auxiliary power electrode 210 may be formed of a triple layer of molybdenum/aluminum-neodymium/molybdenum, molybdenum/aluminum/molybdenum, titanium/aluminum/titanium, or molybdenum/copper/molybdenum titanium. However, it is not limited to theses structures. The first and second source/drain electrodes SD1 and SD2 and the auxiliary power electrode 210 may be formed of a multi-layer made of any one selected from the group consisting of molybdenum (Mo), aluminum (Al), chromium (Cr), gold (Au), titanium (Ti), nickel (Ni), neodymium (Nd), or copper (Cu), and their alloys.

The thin film transistor TR, the storage capacitor Cst, and the auxiliary power electrode 210 disposed on the substrate SUB may constitute a circuit layer (or thin film transistor array layer).

The passivation layer (or first protective layer) PAS may be disposed on the thin film transistor TR and the auxiliary power electrode 210. The passivation layer PAS may be formed to cover the thin film transistor TR and the auxiliary power electrode 210. The passivation layer PAS protects the thin film transistor TR and may be made of an inorganic insulating material. For example, the passivation layer PAS may be formed of a silicon oxide layer SiOx, a silicon nitride layer SiN, a silicon oxynitride layer SiON, or a multi-layer thereof.

The overcoat layer OC (or second protective layer) may be disposed on the passivation layer PAS (or first protective layer). The overcoat layer OC may be provided to planarize the step difference therebelow, and may be formed of an organic insulating material. For example, the overcoat layer OC may be formed of at least one material selected from the group consisting of photo acryl, polyimide, benzocyclobutene resin, and acrylate-based resin.

A pixel electrode PXL (eg, anode electrode or first electrode) may be disposed on the overcoat layer OC (or second protective layer). The pixel electrode PXL may be disposed for each of the plurality of sub pixels SP1, SP2, SP3, and SP4 on the overcoat layer OC. The pixel electrode PXL may be connected to the first source/drain electrode SD1 of the thin film transistor TR through a contact hole penetrating the overcoat layer OC and the passivation layer PAS. Alternatively, the pixel electrode PXL may be connected to the second source/drain electrode SD2 of the thin film transistor TR. A light emitting layer EL and the common electrode COM may be disposed on the pixel electrode PXL. The pixel electrode PXL, the light emitting layer EL, and the common electrode COM may constitute the light emitting device ED.

The pixel electrode PXL may be formed of metal, alloy thereof, or a combination of metal and oxide metal. For example, the pixel electrode PXL may be formed in a multi-layered structure including a transparent conductive layer and an opaque conductive layer having a high reflection efficiency. The transparent conductive layer of the pixel electrode PXL is made of a material having a relatively large work function value such as indium-tin-oxide (ITO) or indium-zinc-oxide (IZO), and the opaque conductive layer may be formed of any one or multiple layers selected from the group consisting of silver (Ag), aluminum (Al), copper (Cu), molybdenum (Mo), titanium (Ti), nickel (Ni), chromium (Cr), or tungsten (W). For example, the pixel electrode PXL may be formed in a structure in which a transparent conductive layer, an opaque conductive layer, and a transparent conductive layer are sequentially stacked, or a structure in which a transparent conductive layer and an opaque conductive layer are sequentially stacked.

The bank layer BA may be disposed on the pixel electrode PXL and the overcoat layer OC. The bank layer BA may cover an edge portion of the pixel electrode PXL and may define an opening of the sub pixel. The bank layer BA may be made of an organic material such as polyimide, acrylate, benzocyclobutene series resin, or the like. The central portion of the pixel electrode PXL exposed by the bank layer BA may be defined as a light emitting area. Also, the bank layer BA may define the contact portion CA that exposes a portion of the auxiliary power electrode 210 to electrically connect the auxiliary power electrode 210 and the common electrode COM.

As shown in FIG. 4, the contact portion CA may expose a portion of the auxiliary power electrode 210 through the passivation layer PAS (or first protective layer), the overcoat layer OC (or second protective layer), and the bank layer BA. The eaves structure 301 may be disposed on the auxiliary power electrode 210 exposed by the contact portion CA.

The eaves structure 301 may be disposed on a portion of the auxiliary power electrode 210 and may include an undercut region. The eaves structure 301 is formed in an island pattern on a portion of the auxiliary power electrode 210, and an exposed region of the auxiliary power electrode 210 may be formed in the periphery of the eaves structure 301. The auxiliary power electrode 210 exposed in the periphery of the eaves structure 301 in the contact portion CA may be in contact with the common electrode COM (eg, cathode electrode or second electrode) and may be electrically connected to the common electrode COM. The eaves structure 301 may be made of the same material as the bank layer BA. The eaves structure 301 and the bank layer BA may be formed at the same time through the same process.

The light emitting layer EL may be disposed on the pixel electrode PXL, the bank layer BA, and the eaves structure 301. The light emitting layer EL may be disconnected in the undercut region of the eaves structure 301 disposed on the auxiliary power electrode 210 exposed by the contact portion CA. For example, the light emitting layer EL may be formed of a material having inferior step coverage. Accordingly, the area of the light emitting layer EL disposed on the auxiliary power electrode 210 is minimized in size by the eaves structure 301, and the light emitting layer EL is disconnected in the undercut region of the eaves structure 301, whereby the auxiliary power electrode 210 provided thereunder may be exposed.

The common electrode COM (eg, cathode electrode or second electrode) may be disposed on the light emitting layer EL and the eaves structure 301. The common electrode COM may be disposed on the pixel electrode PXL and the light emitting layer EL, thereby constituting the light emitting device ED. The common electrode COM may be formed on the entire surface of the substrate SUB. The common electrode COM may be made of a transparent conductive material such as indium-tin-oxide (ITO) or indium-zinc-oxide (IZO), and may be formed of silver (Ag), aluminum (Al), magnesium (Mg), calcium (Ca), or an alloy thereof, wherein the common electrode COM is thin enough to transmit light.

The common electrode COM may be in contact with the auxiliary power electrode 210 exposed by the contact portion CA and may be electrically connected to the auxiliary power electrode 210 exposed by the contact portion CA. The common electrode COM is disposed to cover the bank layer BA and may be disposed on the auxiliary power electrode 210 in the undercut region of the eaves structure 301. For example, the common electrode COM may be formed of a material having excellent step coverage. The step coverage of the common electrode COM is greater than that of the light emitting layer EL formed by evaporation, whereby the common electrode COM may be provided on the upper surface of the auxiliary power electrode 210 exposed to the outside by the disconnection of the light emitting layer EL in the undercut region of the eaves structure 301. Accordingly, the light emitting layer EL is not in contact with the auxiliary power electrode 210 in the undercut region of the eaves structure 301, and the auxiliary power electrode 210 is exposed. However, the common electrode COM may be disposed on the upper surface of the exposed auxiliary power electrode 210 without being covered by the light emitting layer EL, and may be in direct contact with the auxiliary power electrode 210 and may be electrically connected thereto.

Referring to FIG. 5, according to one example of the contact portion CA in the light emitting display device according to the first embodiment of the present disclosure, the contact portion CA may penetrate the passivation layer PAS (or first protective layer), the overcoat layer OC (or second protective layer), and the bank layer BA, to thereby expose a portion of the auxiliary power electrode 210. The eaves structure 301 may be disposed on the auxiliary power electrode 210 exposed by the contact portion CA.

According to one example of the first embodiment of the present disclosure, the eaves structure 301 including an eaves portion 311 and a pillar portion 321 made of a single material, and a support pattern 331 between the eaves structure 301 and the auxiliary power electrode 210 may be disposed on the auxiliary power electrode 210 exposed by the contact portion CA. The eaves structure 301 may contact the upper surface of the auxiliary power electrode 210 through the support pattern 331. The eaves structure 301 and the support pattern 331 may be made of the different materials. For example, the eaves structure 301 may be made of the same material as the bank layer BA. The eaves structure 301 and the bank layer BA may be formed at the same time through the same process. In addition, the support pattern 331 may be formed of the same material as the passivation layer PAS (or first protective layer). The support pattern 331 and the passivation layer PAS may be simultaneously formed through the same process.

The eaves portion 311 of the eaves structure 301 may be disposed on a portion of the auxiliary power electrode 210. The eaves portion 311 may be disposed on the support pattern 331, and may overlap a portion of the exposed auxiliary power electrode 210.

The pillar portion 321 of the eaves structure 301 may protrude from the lower surface of the eaves portion 311, and may be in contact with the upper surface of the auxiliary power electrode 210 through the support pattern 331.

The support pattern 331 may include a lower surface having a first width, an upper surface having a second width narrower than the first width, and an inclined surface between the lower surface and the upper surface. At this time, the width of the eaves portion 311 may have a width wider than the first width of the lower surface of the support pattern 331. Since the eaves portion 311 has a wider width than the support pattern 331, the undercut region may be formed below the eaves portion 311. The undercut region may include a lateral surface of the support pattern 331 below the eaves portion 311.

According to one example of the first embodiment of the present disclosure, the eaves portion 311 of the eaves structure 301 overlaps a portion of the exposed area of the auxiliary power electrode 210, and the undercut region is formed under the eaves portion 311, so that the light emitting layer EL may not be disposed on the auxiliary power electrode 210 corresponding to the undercut region. Since the light emitting layer EL is made of a material that does not have the excellent step coverage, the light emitting layer EL is not provided in the auxiliary power electrode 210 of the undercut region and is disconnected therein, whereby the auxiliary power electrode 210 disposed therebelow may be exposed. On the other hand, since the common electrode COM is made of a material having the greater step coverage in comparison to the light emitting layer EL, the common electrode COM may be formed in the auxiliary power electrode 210 of the undercut region and may be directly in contact with the auxiliary power electrode 210 to be electrically connected thereto. Accordingly, the common electrode COM may be in electrical contact with the auxiliary power electrode 210, to thereby reduce the voltage drop non-uniformity caused by the resistance deviation of the common electrode COM on the entire display panel.

The eaves portion 311 and the pillar portion 321 of the eaves structure 301 and the support pattern 331 according to one example of the first embodiment of the present disclosure may be formed of the same material as those of the passivation layer PAS and the bank layer BA. For example, the passivation layer PAS may form a through hole passing through the auxiliary power electrode 210 positioned thereunder. And, an organic pattern corresponding to the eaves structure 301 may be provided on the passivation layer PAS and may be formed of the same material as that of the bank layer BA. In this case, the organic pattern may be in contact with the auxiliary power electrode 210 through the through hole of the passivation layer PAS. Then, the passivation layer PAS may be etched to expose a portion of the auxiliary power electrode 210 around the organic pattern. Then, the contact portion CA is formed on the passivation layer PAS to expose a portion of the auxiliary power electrode 210, and the eaves structure 301 made of the same material as the bank layer BA may be provided on a portion of the auxiliary power electrode 210 exposed by the contact portion CA, and may be formed in an island pattern. Also, the support pattern 331 formed by the passivation layer PAS remaining without being etched may be provided between the eaves structure 301 and the auxiliary power electrode 210.

According to one example of the contact portion CA of the light emitting display device according to the first embodiment of the present disclosure, the support pattern 331 may be formed on the auxiliary power electrode 210 exposed by the contact portion CA, and the eaves structure 301 may be provided to be in direct contact with the auxiliary power electrode 210 through the support pattern 331. The eaves portion 311 of the eaves structure 301 is formed to have a width wider than that of the support pattern 331, and the eaves structure 301 may include the undercut region under the eaves portion 311. Accordingly, the eaves structure 301 may be formed in one body of the single material such that the eaves portion 311 forming the undercut region and the pillar portion 321 directly contacting the auxiliary power electrode 210 are formed of the single material so that it is possible to improve the adhesive force of the eaves structure 301 and prevent damages such as cracks, thereby forming an undercut shape having a high peeling resistance.

Referring to FIG. 6, according to another example of the contact portion CA of the light emitting display according to the first embodiment of the present disclosure, the contact portion CA may penetrate the passivation layer (or first protective layer), the overcoat layer OC (or second protective layer) and the bank layer BA, to expose a portion of the auxiliary power electrode 210. An eaves structure 301' may be disposed on the auxiliary power electrode 210 exposed by the contact portion CA.

According to another example of the first embodiment of the present disclosure, an eaves structure 301' including an eaves portion 311' and a pillar portion 321' made of a single material may be disposed on the auxiliary power electrode 210 exposed by the contact portion CA. For example, the eaves structure 301' may be made of the same material as that of the bank layer BA. The eaves structure 301' and the bank layer BA may be formed simultaneously through the same process.

The eaves portion 311' of the eaves structure 301' may be disposed on a portion of the auxiliary power electrode 210. The eaves portion 311' may overlap a portion of the exposed auxiliary power electrode 210.

The pillar portion 321' of the eaves structure 301' may protrude from the lower surface of the eaves portion 311' and may contact the upper surface of the auxiliary power electrode 210.

The pillar portion 321' may include an inclined surface having a reverse tapered shape whose upper width that protrudes from the lower surface of the eaves portion 311' is wider than its lower width that contacts the upper surface of the auxiliary power electrode 210. Since the eaves portion 311' has the wider width in comparison to the pillar portion 321', an undercut region may be formed under the eaves portion 311'. This undercut region may include a lower portion of the eaves portion 311' and a lateral surface of the pillar portion 321'.

According to another example of the first embodiment of the present disclosure, the eaves portion 311' of the eaves structure 301' overlaps a portion of the exposed portion of the auxiliary power electrode 210, and the deeper undercut region is formed thereunder, in comparison to the aforementioned eaves structure 301 according to one example of the first embodiment shown in FIG. 5, so that it is possible to increase the exposed portion of the auxiliary power electrode 210 which is not covered by the light emitting layer EL. Accordingly, the contact area between the common electrode COM and the auxiliary power electrode 210 may be increased.

According to another example of the first embodiment of the present disclosure, the eaves portion 311' and the pillar portion 321' of the eaves structure 301' may be formed of the same material as the bank layer BA. For example, the passivation layer PAS may form a through hole passing through the underlying auxiliary power electrode 210. Then, an organic pattern corresponding to the eaves structure 301' may be formed on the passivation layer PAS and may be made of the same material as the bank layer BA. At this time, the organic pattern may be in contact with the auxiliary power electrode 210 through the through hole of the passivation layer PAS. Then, the passivation layer PAS may be etched to expose a portion of the auxiliary power electrode 210 around the organic pattern. Then, the contact portion CA exposing a portion of the auxiliary power electrode 210 may be formed on the passivation layer PAS, and the eaves structure 301' made of the same material as the bank layer BA may be formed in an island pattern on a portion of the auxiliary power electrode 210 exposed by the contact portion CA. In addition, the passivation layer PAS may be completely etched between the eaves structure 301' and the auxiliary power electrode 210, to thereby form the pillar portion 321' of the eaves structure 301'.

According to another example of the contact portion CA of the light emitting display device according to the first embodiment of the present disclosure, the eaves structure 301' including the pillar portion 321' that is in direct contact with the auxiliary power electrode 210 and the eaves portion 311' that forms the undercut region may be formed on the auxiliary power electrode 210 exposed by the contact portion CA. Accordingly, since the eaves portion 311' and the pillar portion 321' are formed in one body of a single material, it is possible to improve the adhesive strength of the eaves structure 301' and prevent damage such as cracks, thereby forming an undercut shape having a high peeling resistance.

Second Embodiment

Figure 7:
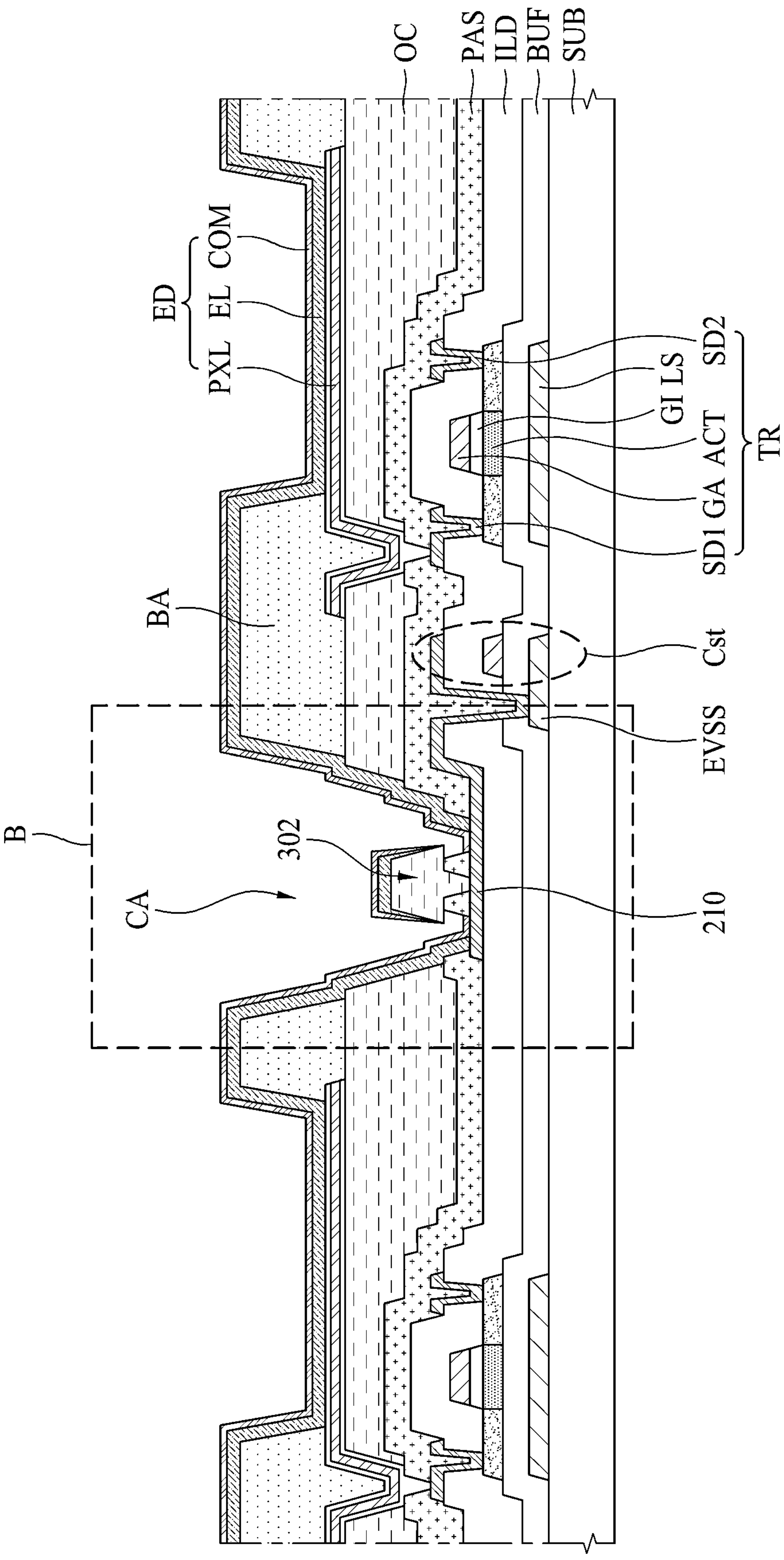
FIG. 7 is a cross sectional view along line I-I' of FIG. 2 according to the second embodiment of the present disclosure.
Figure 8:
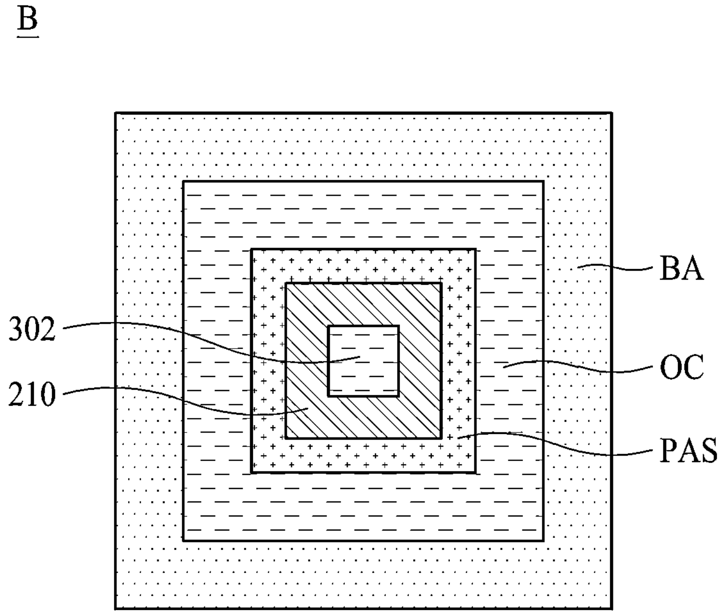
FIG. 8 is a cross sectional view illustrating a contact portion of 'B' portion of FIG. 7 according to the second embodiment of the present disclosure.
Figure 9:
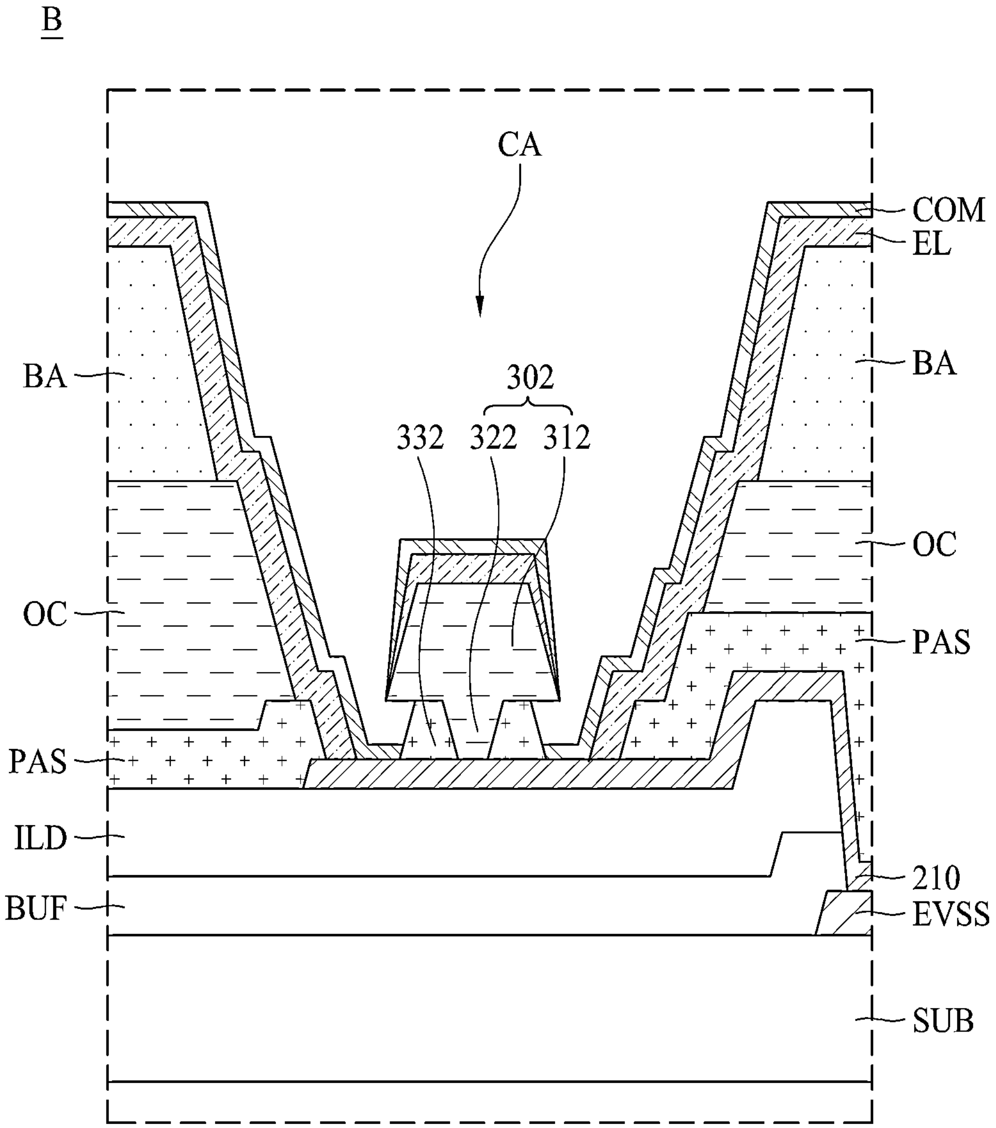
FIG. 9 is a cross sectional view illustrating one example of a contact portion of 'B' portion of FIG. 7 according to the second embodiment of the present disclosure.
Figure 10:
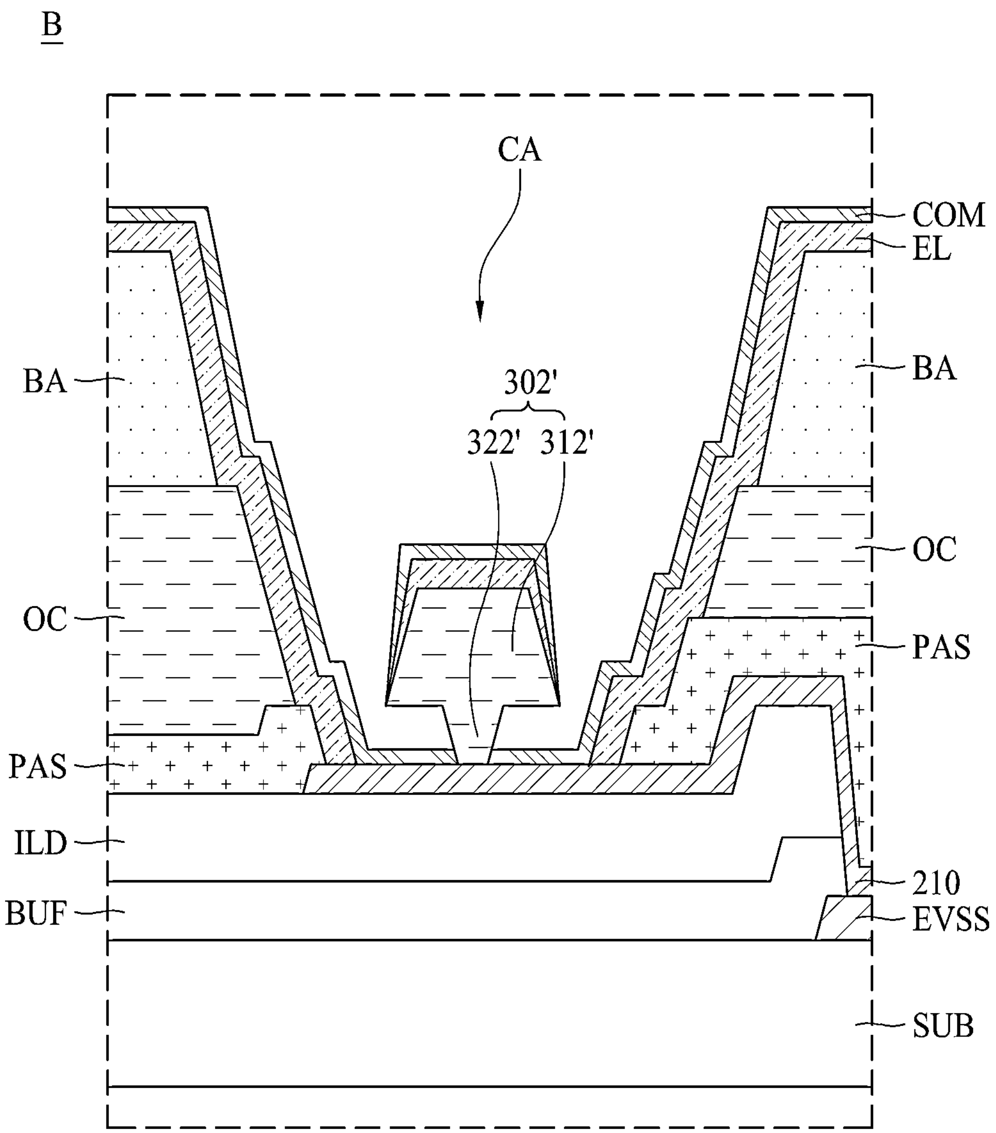
FIG. 10 is a cross sectional view illustrating another example of a contact portion of 'B' portion of FIG. 7 according to the second embodiment of the present disclosure.

FIG. 7 is a cross sectional view along line I-I' of FIG. 2 according to the second embodiment of the present disclosure, and FIG. 8 is a cross sectional view illustrating a contact portion of 'B' portion of FIG. 7 according to the second embodiment of the present disclosure, FIG. 9 is a cross sectional view illustrating one example of a contact portion of 'B' portion of FIG. 7 according to the second embodiment of the present disclosure, and FIG. 10 is a cross sectional view illustrating another example of a contact portion of 'B' portion of FIG. 7 according to the second embodiment of the present disclosure. In the description of the second embodiment, a description of the same configuration as that of the first embodiment will be omitted.

Referring to FIGS. 7 and 8, the light emitting display device according to the second embodiment of the present disclosure may include a substrate SUB, a light shielding layer LS, an auxiliary power line EVSS (or second power line), a buffer layer BUF, a thin film transistor TR, a storage capacitor Cst, a gate insulating film GI, an insulating interlayer ILD, an auxiliary power electrode 210, a passivation layer PAS (or first protective layer), an overcoat layer OC (or second protective layer), a light emitting device ED, a bank layer BA, a contact portion CA, and an eaves structure 302.

As shown in FIG. 8, the contact portion CA may expose a portion of the auxiliary power electrode 210 through the passivation layer PAS (or first protective layer), the overcoat layer OC (or second protective layer), and the bank layer BA. The eaves structure 302 may be disposed on the auxiliary power electrode 210 exposed by the contact portion CA.

The eaves structure 302 may be disposed on a portion of the auxiliary power electrode 210 and may include an undercut region. The eaves structure 302 is formed in an island pattern on a portion of the auxiliary power electrode 210, and an exposed region of the auxiliary power electrode 210 may be formed in the periphery of the eaves structure 302. The auxiliary power electrode 210 exposed in the periphery of the eaves structure 302 in the contact portion CA may be in contact with the common electrode COM (eg, cathode electrode or second electrode) and may be electrically connected to the common electrode COM. The eaves structure 302 may be made of the same material as the overcoat layer OC. The eaves structure 302 and the overcoat layer OC may be formed at the same time through the same process.

The light emitting layer EL may be disposed on the pixel electrode PXL, the bank layer BA, and the eaves structure 302. The light emitting layer EL may be disconnected in the undercut region of the eaves structure 302 disposed on the auxiliary power electrode 210 exposed by the contact portion CA. For example, the light emitting layer EL may be formed of a material having inferior step coverage. Accordingly, the area of the light emitting layer EL disposed on the auxiliary power electrode 210 is minimized in size by the eaves structure 302, and the light emitting layer EL is disconnected in the undercut region of the eaves structure 302, whereby the auxiliary power electrode 210 provided thereunder may be exposed.

The common electrode COM (eg, cathode electrode or second electrode) may be disposed on the light emitting layer EL and the eaves structure 302. The common electrode COM may be disposed on the pixel electrode PXL and the light emitting layer EL, thereby constituting the light emitting device ED. The common electrode COM may be formed on the entire surface of the substrate SUB. The common electrode COM may be made of a transparent conductive material such as indium-tin-oxide (ITO) or indium-zinc-oxide (IZO), and may be formed of silver (Ag), aluminum (Al), magnesium (Mg), calcium (Ca), or an alloy thereof, wherein the common electrode COM is thin enough to transmit light.

The common electrode COM may be in contact with the auxiliary power electrode 210 exposed by the contact portion CA and may be electrically connected to the auxiliary power electrode 210 exposed by the contact portion CA. The common electrode COM is disposed to cover the bank layer BA and may be disposed on the auxiliary power electrode 210 in the undercut region of the eaves structure 302. For example, the common electrode COM may be formed of a material having excellent step coverage. The step coverage of the common electrode COM is greater than that of the light emitting layer EL formed by evaporation, whereby the common electrode COM may be provided on the upper surface of the auxiliary power electrode 210 exposed to the outside by the disconnection of the light emitting layer EL in the undercut region of the eaves structure 302. Accordingly, the light emitting layer EL is not in contact with the auxiliary power electrode 210 in the undercut region of the eaves structure 302, and the auxiliary power electrode 210 is exposed. However, the common electrode COM may be disposed on the upper surface of the exposed auxiliary power electrode 210 without being covered by the light emitting layer EL, and may be in direct contact with the auxiliary power electrode 210 and may be electrically connected thereto.

Referring to FIG. 9, according to one example of the contact portion CA in the light emitting display device according to the second embodiment of the present disclosure, the contact portion CA may penetrate the passivation layer PAS (or first protective layer), the overcoat layer OC (or second protective layer), and the bank layer BA, to thereby expose a portion of the auxiliary power electrode 210. The eaves structure 302 may be disposed on the auxiliary power electrode 210 exposed by the contact portion CA.

According to one example of the second embodiment of the present disclosure, the eaves structure 302 including an eaves portion 312 and a pillar portion 322 made of a single material, and a support pattern 332 between the eaves structure 302 and the auxiliary power electrode 210 may be disposed on the auxiliary power electrode 210 exposed by the contact portion CA. The eaves structure 302 may contact the upper surface of the auxiliary power electrode 210 through the support pattern 332. The eaves structure 302 and the support pattern 332 may be made of the different materials. For example, the eaves structure 302 may be made of the same material as the overcoat layer OC. The eaves structure 302 and the overcoat layer OC may be formed at the same time through the same process. In addition, the support pattern 332 may be formed of the same material as the passivation layer PAS (or first protective layer). The support pattern 332 and the passivation layer PAS may be simultaneously formed through the same process.

The eaves portion 312 of the eaves structure 302 may be disposed on a portion of the auxiliary power electrode 210. The eaves portion 312 may be disposed on the support pattern 332, and may overlap a portion of the exposed auxiliary power electrode 210.

The pillar portion 322 of the eaves structure 302 may protrude from the lower surface of the eaves portion 312, and may be in contact with the upper surface of the auxiliary power electrode 210 through the support pattern 332.

The support pattern 332 may include a lower surface having a first width, an upper surface having a second width narrower than the first width, and an inclined surface between the lower surface and the upper surface. At this time, the width of the eaves portion 312 may have a width wider than the first width of the lower surface of the support pattern 332. Since the eaves portion 312 has a wider width than the support pattern 332, the undercut region may be formed below the eaves portion 312. The undercut region may include a lateral surface of the support pattern 332 below the eaves portion 312.

According to one example of the second embodiment of the present disclosure, the eaves portion 312 of the eaves structure 302 overlaps a portion of the exposed area of the auxiliary power electrode 210, and the undercut region is formed under the eaves portion 312, so that the light emitting layer EL may not be disposed on the auxiliary power electrode 210 corresponding to the undercut region. Since the light emitting layer EL is made of a material that does not have the excellent step coverage, the light emitting layer EL is not provided in the auxiliary power electrode 210 of the undercut region and is disconnected therein, whereby the auxiliary power electrode 210 disposed therebelow may be exposed. On the other hand, since the common electrode COM is made of a material having the greater step coverage in comparison to the light emitting layer EL, the common electrode COM may be formed in the auxiliary power electrode 210 of the undercut region and may be directly in contact with the auxiliary power electrode 210 to be electrically connected thereto. Accordingly, the common electrode COM may be in electrical contact with the auxiliary power electrode 210, to thereby reduce the voltage drop non-uniformity caused by the resistance deviation of the common electrode COM on the entire display panel.

The eaves portion 312 and the pillar portion 322 of the eaves structure 302 and the support pattern 332 according to one example of the second embodiment of the present disclosure may be formed of the same material as those of the passivation layer PAS and the overcoat layer OC. For example, the passivation layer PAS may form a through hole passing through the auxiliary power electrode 210 positioned thereunder. And, an organic pattern corresponding to the eaves structure 302 may be provided on the passivation layer PAS and may be formed of the same material as that of the overcoat layer OC. In this case, the organic pattern may be in contact with the auxiliary power electrode 210 through the through hole of the passivation layer PAS. Then, the passivation layer PAS may be etched to expose a portion of the auxiliary power electrode 210 around the organic pattern. Then, the contact portion CA is formed on the passivation layer PAS to expose a portion of the auxiliary power electrode 210, and the eaves structure 302 made of the same material as overcoat layer OC may be provided on a portion of the auxiliary power electrode 210 exposed by the contact portion CA, and may be formed in an island pattern. Also, the support pattern 332 formed by the passivation layer PAS remaining without being etched may be provided between the eaves structure 302 and the auxiliary power electrode 210.

According to one example of the contact portion CA of the light emitting display device according to the second embodiment of the present disclosure, the support pattern 332 may be formed on the auxiliary power electrode 210 exposed by the contact portion CA, and the eaves structure 302 may be provided to be in direct contact with the auxiliary power electrode 210 through the support pattern 332. The eaves portion 312 of the eaves structure 302 is formed to have a width wider than that of the support pattern 332, and the eaves structure 302 may include the undercut region under the eaves portion 312. Accordingly, the eaves structure 302 may be formed in one body of the single material such that the eaves portion 312 forming the undercut region and the pillar portion 322 directly contacting the auxiliary power electrode 210 are formed of the single material so that it is possible to improve the adhesive force of the eaves structure 302 and prevent damages such as cracks, thereby forming an undercut shape having a high peeling resistance.

Referring to FIG. 10, according to another example of the contact portion CA of the light emitting display according to the second embodiment of the present disclosure, the contact portion CA may penetrate the passivation layer (or first protective layer), the overcoat layer OC (or second protective layer) and the bank layer BA, to expose a portion of the auxiliary power electrode 210. An eaves structure 302' may be disposed on the auxiliary power electrode 210 exposed by the contact portion CA.

According to another example of the second embodiment of the present disclosure, an eaves structure 302' including an eaves portion 312' and a pillar portion 322' made of a single material may be disposed on the auxiliary power electrode 210 exposed by the contact portion CA. For example, the eaves structure 302' may be made of the same material as that of the overcoat layer OC. The eaves structure 302' and the overcoat layer OC may be formed simultaneously through the same process.

The eaves portion 312' of the eaves structure 302' may be disposed on a portion of the auxiliary power electrode 210. The eaves portion 312' may overlap a portion of the exposed auxiliary power electrode 210.

The pillar portion 322' of the eaves structure 302' may protrude from the lower surface of the eaves portion 312' and may contact the upper surface of the auxiliary power electrode 210.

The pillar portion 322' may include an inclined surface having a reverse tapered shape whose upper width that protrudes from the lower surface of the eaves portion 312' is wider than its lower width that contacts the upper surface of the auxiliary power electrode 210. Since the eaves portion 312' has the wider width in comparison to the pillar portion 322', an undercut region may be formed under the eaves portion 312'. This undercut region may include a lower portion of the eaves portion 312' and a lateral surface of the pillar portion 322'.

According to another example of the second embodiment of the present disclosure, the eaves portion 312' of the eaves structure 302' overlaps a portion of the exposed portion of the auxiliary power electrode 210, and the deeper undercut region is formed thereunder, in comparison to the aforementioned eaves structure 302 according to one example of the second embodiment shown in FIG. 9, so that it is possible to increase the exposed portion of the auxiliary power electrode 210 which is not covered by the light emitting layer EL. Accordingly, the contact area between the common electrode COM and the auxiliary power electrode 210 may be increased.

According to another example of the second embodiment of the present disclosure, the eaves portion 312' and the pillar portion 322' of the eaves structure 302' may be formed of the same material as the overcoat layer OC. For example, the passivation layer PAS may form a through hole passing through the underlying auxiliary power electrode 210. Then, an organic pattern corresponding to the eaves structure 302' may be formed on the passivation layer PAS and may be made of the same material as the overcoat layer OC. At this time, the organic pattern may be in contact with the auxiliary power electrode 210 through the through hole of the passivation layer PAS. Then, the passivation layer PAS may be etched to expose a portion of the auxiliary power electrode 210 around the organic pattern. Then, the contact portion CA exposing a portion of the auxiliary power electrode 210 may be formed on the passivation layer PAS, and the eaves structure 302' made of the same material as the overcoat layer OC may be formed in an island pattern on a portion of the auxiliary power electrode 210 exposed by the contact portion CA. In addition, the passivation layer PAS may be completely etched between the eaves structure 302' and the auxiliary power electrode 210, to thereby form the pillar portion 322' of the eaves structure 302'.

According to another example of the contact portion CA of the light emitting display device according to the second embodiment of the present disclosure, the eaves structure 302' including the pillar portion 322' that is in direct contact with the auxiliary power electrode 210 and the eaves portion 312' that forms the undercut region may be formed on the auxiliary power electrode 210 exposed by the contact portion CA. Accordingly, since the eaves portion 312' and the pillar portion 322' are formed in one body of a single material, it is possible to improve the adhesive strength of the eaves structure 302' and prevent damage such as cracks, thereby forming an undercut shape having a high peeling resistance.

Third Embodiment

Figure 11:
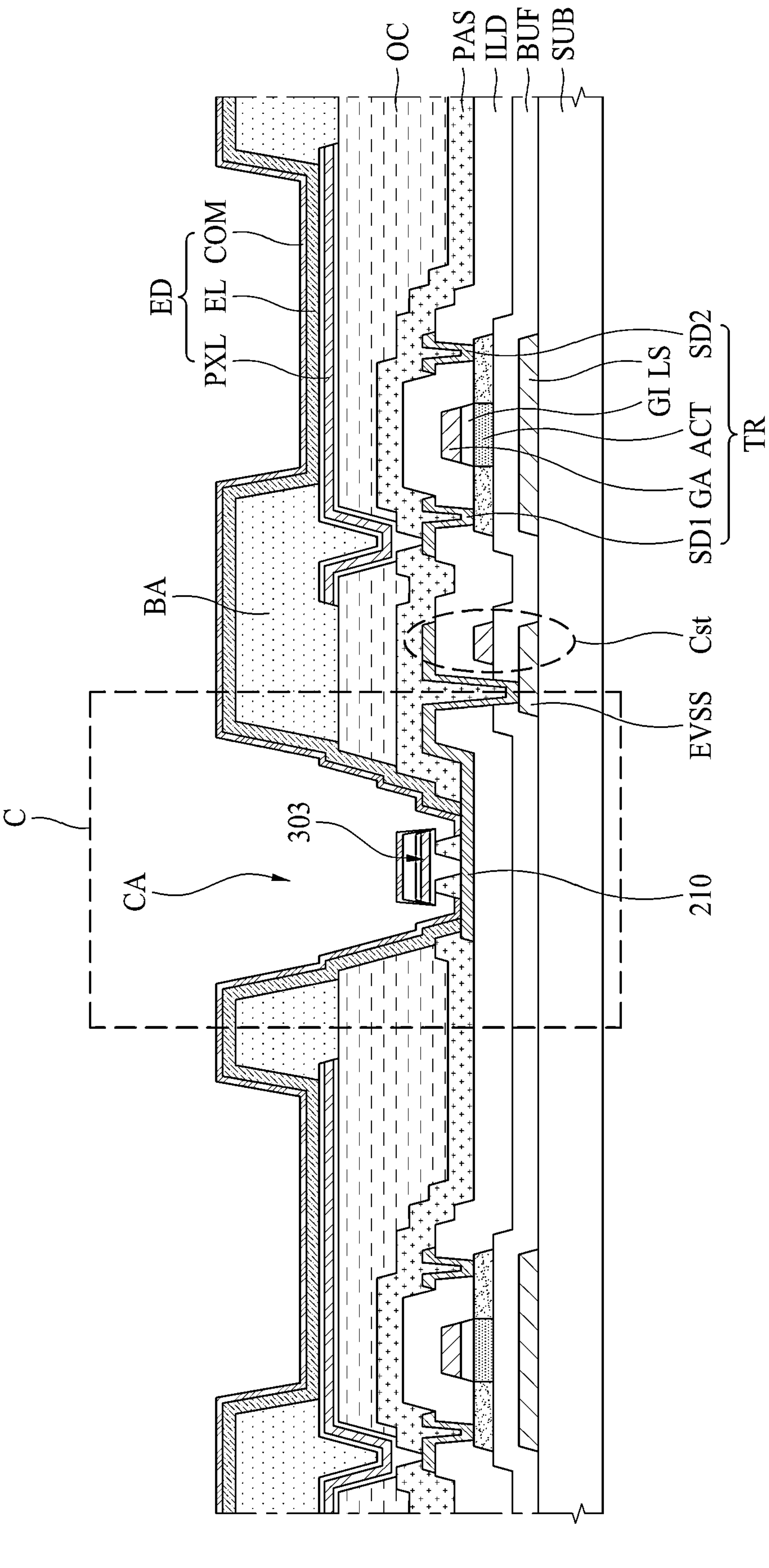
FIG. 11 is a cross sectional view along line I-I' of FIG. 2 according to the third embodiment of the present disclosure.
Figure 12:
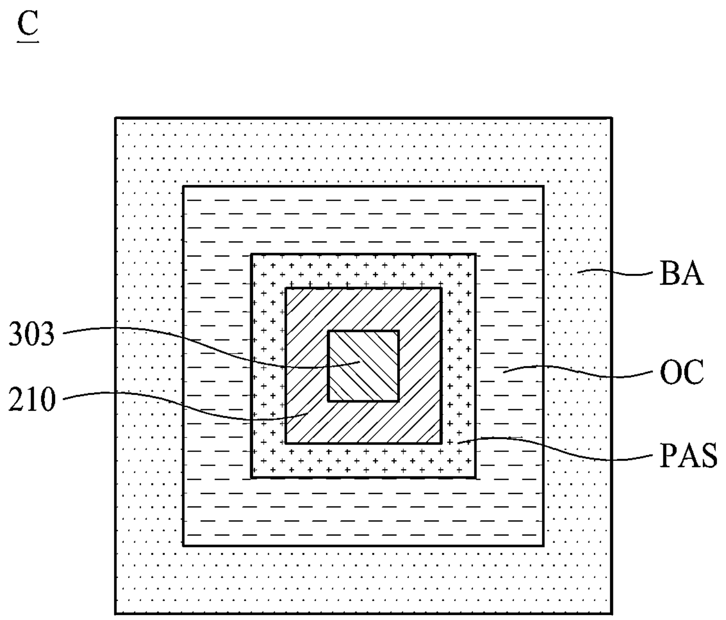
FIG. 12 is a plan view illustrating a contact portion of 'C' portion of FIG. 11 according to the third embodiment of the present disclosure.
Figure 13:
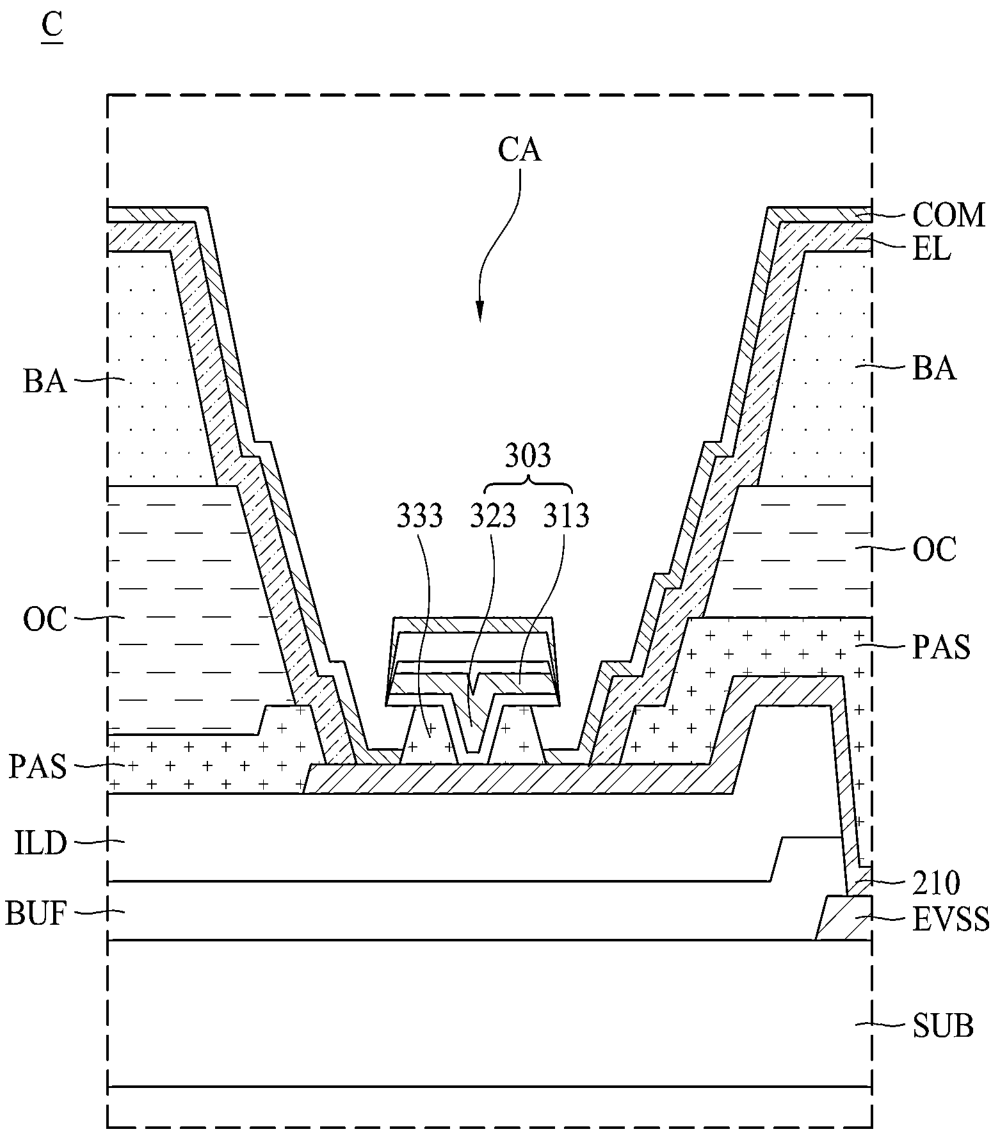
FIG. 13 is a cross sectional view illustrating one example of a contact portion of 'C' portion of FIG. 11 according to the third embodiment of the present disclosure.
Figure 14:
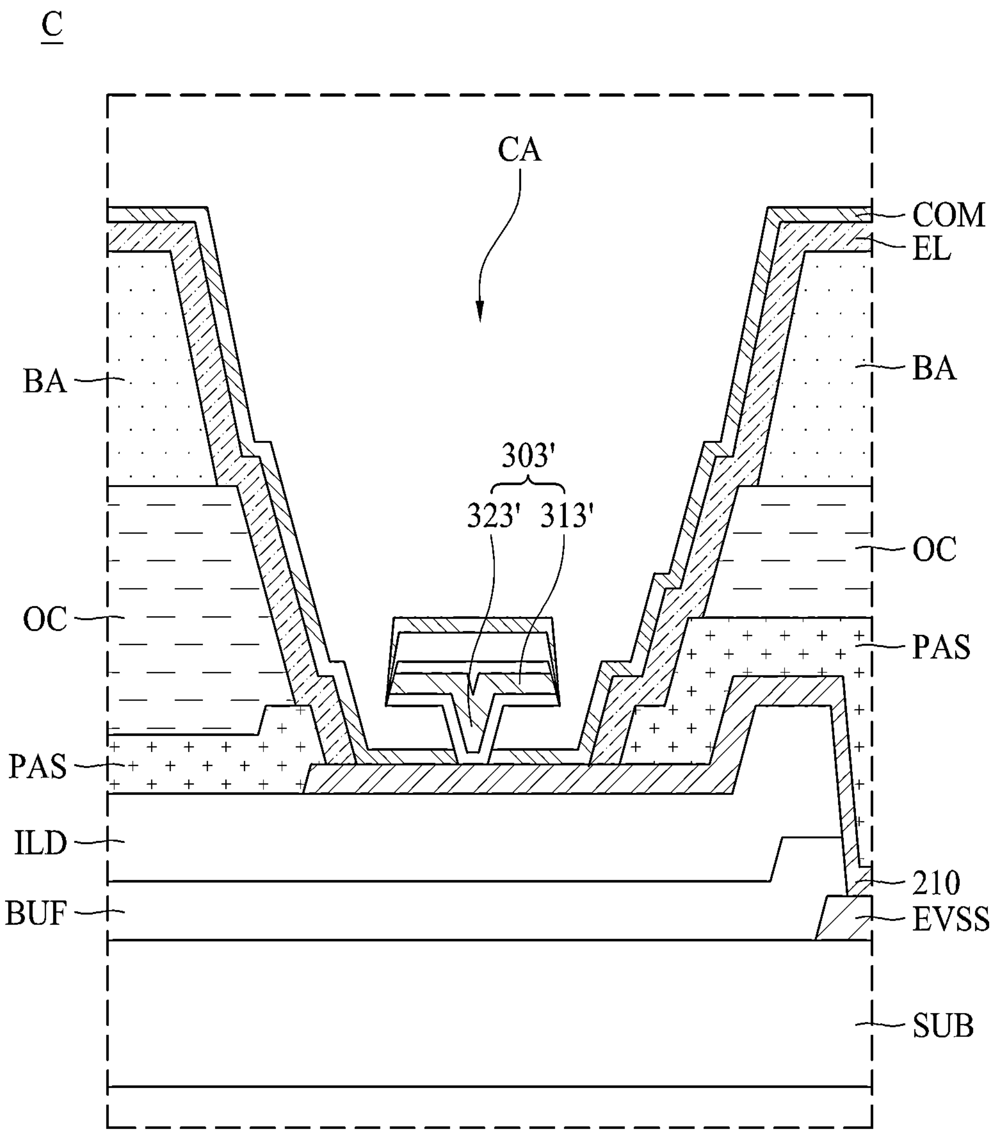
FIG. 14 is a cross sectional view illustrating another example of a contact portion of 'C' portion of FIG. 11 according to the third embodiment of the present disclosure.

FIG. 11 is a cross sectional view along line I-I' of FIG. 2 according to the third embodiment of the present disclosure, FIG. 12 is a plan view illustrating a contact portion of 'C' portion of FIG. 11 according to the third embodiment of the present disclosure, FIG. 13 is a cross sectional view illustrating one example of a contact portion of 'C' portion of FIG. 11 according to the third embodiment of the present disclosure, and FIG. 14 is a cross sectional view illustrating another example of a contact portion of 'C' portion of FIG. 11 according to the third embodiment of the present disclosure. In the description of the third embodiment, a description of the same configuration as that of the first and second embodiments will be omitted.

Referring to FIGS. 11 and 12, the light emitting display device according to the third embodiment of the present disclosure may include a substrate SUB, a light shielding layer LS, an auxiliary power line EVSS (or second power line), a buffer layer BUF, a thin film transistor TR, a storage capacitor Cst, a gate insulating film GI, an insulating interlayer ILD, an auxiliary power electrode 210, a passivation layer PAS (or first protective layer), an overcoat layer OC (or second protective layer), a light emitting device ED, a bank layer BA, a contact portion CA, and an eaves structure 303.

As shown in FIG. 12, the contact portion CA may expose a portion of the auxiliary power electrode 210 through the passivation layer PAS (or first protective layer), the overcoat layer OC (or second protective layer), and the bank layer BA. The eaves structure 303 may be disposed on the auxiliary power electrode 210 exposed by the contact portion CA.

The eaves structure 303 may be disposed on a portion of the auxiliary power electrode 210 and may include an undercut region. The eaves structure 303 is formed in an island pattern on a portion of the auxiliary power electrode 210, and an exposed region of the auxiliary power electrode 210 may be formed in the periphery of the eaves structure 303. The auxiliary power electrode 210 exposed in the periphery of the eaves structure 303 in the contact portion CA may be in contact with the common electrode COM (eg, cathode electrode or second electrode) and may be electrically connected to the common electrode COM. The eaves structure 303 may be made of the same material as the pixel electrode PXL. The eaves structure 303 and the pixel electrode PXL may be formed at the same time through the same process.

The light emitting layer EL may be disposed on the pixel electrode PXL, the bank layer BA, and the eaves structure 303. The light emitting layer EL may be disconnected in the undercut region of the eaves structure 303 disposed on the auxiliary power electrode 210 exposed by the contact portion CA. For example, the light emitting layer EL may be formed of a material having inferior step coverage. Accordingly, the area of the light emitting layer EL disposed on the auxiliary power electrode 210 is minimized in size by the eaves structure 303, and the light emitting layer EL is disconnected in the undercut region of the eaves structure 303, whereby the auxiliary power electrode 210 provided thereunder may be exposed.

The common electrode COM (eg, cathode electrode or second electrode) may be disposed on the light emitting layer EL and the eaves structure 303. The common electrode COM may be disposed on the pixel electrode PXL and the light emitting layer EL, thereby constituting the light emitting device ED. The common electrode COM may be formed on the entire surface of the substrate SUB. The common electrode COM may be made of a transparent conductive material such as indium-tin-oxide (ITO) or indium-zinc-oxide (IZO), and may be formed of silver (Ag), aluminum (Al), magnesium (Mg), calcium (Ca), or an alloy thereof, wherein the common electrode COM is thin enough to transmit light.

The common electrode COM may be in contact with the auxiliary power electrode 210 exposed by the contact portion CA and may be electrically connected to the auxiliary power electrode 210 exposed by the contact portion CA. The common electrode COM is disposed to cover the bank layer BA and may be disposed on the auxiliary power electrode 210 in the undercut region of the eaves structure 303. For example, the common electrode COM may be formed of a material having excellent step coverage. The step coverage of the common electrode COM is greater than that of the light emitting layer EL formed by evaporation, whereby the common electrode COM may be provided on the upper surface of the auxiliary power electrode 210 exposed to the outside by the disconnection of the light emitting layer EL in the undercut region of the eaves structure 303. Accordingly, the light emitting layer EL is not in contact with the auxiliary power electrode 210 in the undercut region of the eaves structure 303, and the auxiliary power electrode 210 is exposed. However, the common electrode COM may be disposed on the upper surface of the exposed auxiliary power electrode 210 without being covered by the light emitting layer EL, and may be in direct contact with the auxiliary power electrode 210 and may be electrically connected thereto.

Referring to FIG. 13, according to one example of the contact portion CA in the light emitting display device according to the third embodiment of the present disclosure, the contact portion CA may penetrate the passivation layer PAS (or first protective layer), the overcoat layer OC (or second protective layer), and the bank layer BA, to thereby expose a portion of the auxiliary power electrode 210. The eaves structure 303 may be disposed on the auxiliary power electrode 210 exposed by the contact portion CA.

According to one example of the third embodiment of the present disclosure, the eaves structure 303 including an eaves portion 313 and a pillar portion 323 made of a single material, and a support pattern 333 between the eaves structure 303 and the auxiliary power electrode 210 may be disposed on the auxiliary power electrode 210 exposed by the contact portion CA. The eaves structure 303 may contact the upper surface of the auxiliary power electrode 210 through the support pattern 333. The eaves structure 303 and the support pattern 333 may be made of the different materials. For example, the eaves structure 303 may be made of the same material as the pixel electrode PXL. The eaves structure 303 and the pixel electrode PXL may be formed at the same time through the same process. In addition, the support pattern 333 may be formed of the same material as the passivation layer PAS (or first protective layer). The support pattern 333 and the passivation layer PAS may be simultaneously formed through the same process.

The eaves portion 313 of the eaves structure 303 may be disposed on a portion of the auxiliary power electrode 210. The eaves portion 313 may be disposed on the support pattern 333, and may overlap a portion of the exposed auxiliary power electrode 210.

The pillar portion 323 of the eaves structure 303 may protrude from the lower surface of the eaves portion 313, and may be in contact with the upper surface of the auxiliary power electrode 210 through the support pattern 333.

The support pattern 333 may include a lower surface having a first width, an upper surface having a second width narrower than the first width, and an inclined surface between the lower surface and the upper surface. At this time, the width of the eaves portion 313 may have a width wider than the first width of the lower surface of the support pattern 333. Since the eaves portion 313 has a wider width than the support pattern 333, the undercut region may be formed below the eaves portion 313. The undercut region may include a lateral surface of the support pattern 333 below the eaves portion 313.

According to one example of the third embodiment of the present disclosure, the eaves portion 313 of the eaves structure 303 overlaps a portion of the exposed area of the auxiliary power electrode 210, and the undercut region is formed under the eaves portion 313, so that the light emitting layer EL may not be disposed on the auxiliary power electrode 210 corresponding to the undercut region. Since the light emitting layer EL is made of a material that does not have the excellent step coverage, the light emitting layer EL is not provided in the auxiliary power electrode 210 of the undercut region and is disconnected therein, whereby the auxiliary power electrode 210 disposed therebelow may be exposed. On the other hand, since the common electrode COM is made of a material having the greater step coverage in comparison to the light emitting layer EL, the common electrode COM may be formed in the auxiliary power electrode 210 of the undercut region and may be directly in contact with the auxiliary power electrode 210 to be electrically connected thereto. Accordingly, the common electrode COM may be in electrical contact with the auxiliary power electrode 210, to thereby reduce the voltage drop non-uniformity caused by the resistance deviation of the common electrode COM on the entire display panel.

The eaves portion 313 and the pillar portion 323 in the eaves structure 303, and the support pattern 333 according to the third embodiment of the present disclosure may be formed of the same material as the passivation layer PAS and the pixel electrode PXL. For example, the passivation layer PAS may form a through hole passing through the underlying auxiliary power electrode 210. A metal pattern corresponding to the eaves structure 303 may be disposed on the passivation layer PAS and may be formed of the same material as the pixel electrode PXL. At this time, the metal pattern may be in contact with the auxiliary power electrode 210 through the through hole of the passivation layer PAS. Then, the passivation layer PAS may be etched to expose a portion of the auxiliary power electrode 210 around the metal pattern. Then, the contact portion CA is formed on the passivation layer PAS to expose a portion of the auxiliary power electrode 210, and the eaves structure 303 made of the same material as the pixel electrode PXL may be provided on a portion of the auxiliary power electrode 210 exposed by the contact portion CA, and may be formed in an island pattern. Also, the support pattern 333 formed by the passivation layer PAS remaining without being etched may be provided between the eaves structure 303 and the auxiliary power electrode 210.

According to one example of the contact portion CA of the light emitting display device according to the third embodiment of the present disclosure, the support pattern 333 may be formed on the auxiliary power electrode 210 exposed by the contact portion CA, and the eaves structure 303 may be provided to be in direct contact with the auxiliary power electrode 210 through the support pattern 333. The eaves portion 313 of the eaves structure 303 is formed to have a width wider than that of the support pattern 333, and the eaves structure 303 may include the undercut region under the eaves portion 313. Accordingly, the eaves structure 303 may be formed in one body of the single material such that the eaves portion 313 forming the undercut region and the pillar portion 323 directly contacting the auxiliary power electrode 210 are formed of the single material so that it is possible to improve the adhesive force of the eaves structure 303 and prevent damages such as cracks, thereby forming an undercut shape having a high peeling resistance.

Referring to FIG. 14, according to another example of the contact portion CA of the light emitting display according to the third embodiment of the present disclosure, the contact portion CA may penetrate the passivation layer (or first protective layer), the overcoat layer OC (or second protective layer) and the bank layer BA, to expose a portion of the auxiliary power electrode 210. An eaves structure 303' may be disposed on the auxiliary power electrode 210 exposed by the contact portion CA.

According to another example of the third embodiment of the present disclosure, an eaves structure 303' including an eaves portion 313' and a pillar portion 323' made of a single material may be disposed on the auxiliary power electrode 210 exposed by the contact portion CA. For example, the eaves structure 303' may be made of the same material as that of the pixel electrode PXL. The eaves structure 303' and the pixel electrode PXL may be formed simultaneously through the same process.

The eaves portion 313' of the eaves structure 303' may be disposed on a portion of the auxiliary power electrode 210. The eaves portion 313' may overlap a portion of the exposed auxiliary power electrode 210.

The pillar portion 323' of the eaves structure 303' may protrude from the lower surface of the eaves portion 313' and may contact the upper surface of the auxiliary power electrode 210.

The pillar portion 323' may include an inclined surface having a reverse tapered shape whose upper width that protrudes from the lower surface of the eaves portion 313' is wider than its lower width that contacts the upper surface of the auxiliary power electrode 210. Since the eaves portion 313' has the wider width in comparison to the pillar portion 323', an undercut region may be formed under the eaves portion 313'. This undercut region may include a lower portion of the eaves portion 313' and a lateral surface of the pillar portion 323'.

According to another example of the third embodiment of the present disclosure, the eaves portion 313' of the eaves structure 303' overlaps a portion of the exposed portion of the auxiliary power electrode 210, and the deeper undercut region is formed thereunder, in comparison to the aforementioned eaves structure 303 according to one example of the third embodiment shown in FIG. 13, so that it is possible to increase the exposed portion of the auxiliary power electrode 210 which is not covered by the light emitting layer EL. Accordingly, the contact area between the common electrode COM and the auxiliary power electrode 210 may be increased.

According to another example of the third embodiment of the present disclosure, the eaves portion 313' and the pillar portion 323' of the eaves structure 303' may be formed of the same material as the pixel electrode PXL. For example, the passivation layer PAS may form a through hole passing through the underlying auxiliary power electrode 210. A metal pattern corresponding to the eaves structure 303' may be provided on the passivation layer PAS and may be formed of the same material as the pixel electrode PXL. At this time, the metal pattern may be in contact with the auxiliary power electrode 210 through the through hole of the passivation layer PAS. Then, the passivation layer PAS may be etched to expose a portion of the auxiliary power electrode 210 around the metal pattern. Then, the contact portion CA exposing a portion of the auxiliary power electrode 210 may be formed on the passivation layer PAS, and the eaves structure 303' made of the same material as the pixel electrode PXL may be formed in an island pattern on a portion of the auxiliary power electrode 210 exposed by the contact portion CA. Also, the passivation layer PAS may be completely etched between the eaves structure 303' and the auxiliary power electrode 210, to thereby form the pillar portion 323' of the eaves structure 303'.

According to another example of the contact portion CA of the light emitting display device according to the third embodiment of the present disclosure, the eaves structure 303' including the pillar portion 323' that is in direct contact with the auxiliary power electrode 210 and the eaves portion 313' that forms the undercut region may be formed on the auxiliary power electrode 210 exposed by the contact portion CA. Accordingly, since the eaves portion 313' and the pillar portion 323' are formed in one body of a single material, it is possible to improve the adhesive strength of the eaves structure 303' and prevent damage such as cracks, thereby forming an undercut shape having a high peeling resistance.

The light emitting display device according to an embodiment of the present disclosure may be described as follows.

The light emitting display device according to an embodiment of the present disclosure may include a circuit layer having a thin film transistor and an auxiliary power electrode over a substrate, a protective layer overlaying the circuit layer, a contact portion configured to expose a portion of the auxiliary power electrode, an eaves structure disposed over a portion of the auxiliary power electrode and configured to have an undercut region, a pixel electrode disposed over the protective layer and connected to the thin film transistor, a light emitting layer disposed over the pixel electrode, and a common electrode disposed over the light emitting layer and connected to the auxiliary power electrode in the undercut region of the eaves structure, wherein the eaves structure is made of a single material.

In the light emitting display device according to an embodiment of the present disclosure, the eaves structure may include an eaves portion disposed over a portion of the auxiliary power electrode, and a pillar portion protruding from a lower surface of the eaves portion and contacting an upper surface of the auxiliary power electrode, wherein the undercut region corresponds to a lower portion of the eaves portion.

In the light emitting display device according to an embodiment of the present disclosure, the pillar portion may include an inclined surface having a reverse tapered shape whose upper width that protrudes from the lower surface of the eaves portion is wider than its lower width that contacts the upper surface of the auxiliary power electrode.

In the light emitting display device according to an embodiment of the present disclosure, the eaves structure may be formed in an island pattern over a portion of the auxiliary power electrode, and the portion of the auxiliary power electrode exposed by the contact portion may include an exposed portion of the auxiliary power electrode in the periphery of the eaves structure.

In the light emitting display device according to an embodiment of the present disclosure, the eaves portion may overlap at least a portion of the exposed portion of the auxiliary power electrode.

In the light emitting display device according to an embodiment of the present disclosure may include a support pattern between a portion of the auxiliary power electrode and the eaves structure, the eaves structure may be in contact with an upper surface of the auxiliary power electrode through the support pattern.

In the light emitting display device according to an embodiment of the present disclosure, the eaves structure and the support pattern may be made of different materials from each other.

In the light emitting display device according to an embodiment of the present disclosure, the eaves structure may include an eaves portion disposed over the support pattern, and a pillar portion protruding from a lower surface of the eaves portion and configured to be in contact with an upper surface of the auxiliary power electrode through the support pattern, the undercut region may include a lower portion of the eaves portion and a lateral surface of the pillar portion.

In the light emitting display device according to an embodiment of the present disclosure, the support pattern may include a lower surface having a first width, an upper surface having a second width which is narrower than the first width, and an inclined surface between the lower surface and the upper surface, the width of the eaves portion may be wider than the first width.

The light emitting display device according to an embodiment of the present disclosure may include a circuit layer having a thin film transistor and an auxiliary power electrode over a substrate, a first protective layer overlaying the circuit layer, a second protective layer disposed over the first protective layer, a pixel electrode disposed over the second protective layer and connected to the thin film transistor, a bank layer disposed over the second protective layer and configured to define an opening at the pixel electrode, a contact portion which penetrates the first and second protective layers and the bank layer to expose a portion of the auxiliary power electrode, an eaves structure disposed over a portion of the auxiliary power electrode exposed by the contact portion and configured to include an undercut region, a light emitting layer disposed over the pixel electrode and the bank layer, and a common electrode disposed over the light emitting layer and connected to the auxiliary power electrode in the undercut region of the eaves structure.

In the light emitting display device according to an embodiment of the present disclosure, the first protective layer may be made of an inorganic insulating material, and the second protective layer may be made of an organic insulating material.

In the light emitting display device according to an embodiment of the present disclosure, the undercut region of the eaves structure may be formed at the same layer as the first protective layer.

In the light emitting display device according to an embodiment of the present disclosure, the eaves structure may be made of the same material as that at least one of the bank layer, the second protective layer, and the pixel electrode.

In the light emitting display device according to an embodiment of the present disclosure, the eaves structure may include an eaves portion disposed over a portion of the auxiliary power electrode, and a pillar portion protruding from a lower surface of the eaves portion and contacting an upper surface of the auxiliary power electrode, wherein a height of the pillar portion may be lower than or equal to a height of the first protective layer.

In the light emitting display device according to an embodiment of the present disclosure, the pillar portion may include an inclined surface having a reverse tapered shape whose upper width that protrudes from the lower surface of the eaves portion is wider than its lower width that contacts the upper surface of the auxiliary power electrode.

In the light emitting display device according to an embodiment of the present disclosure may include a support pattern between a portion of the auxiliary power electrode and the eaves structure, the eaves structure may be in contact with an upper surface of the auxiliary power electrode through the support pattern.

In the light emitting display device according to an embodiment of the present disclosure, the support pattern may be made of the same material as that of the first protective layer.

In the light emitting display device according to an embodiment of the present disclosure, the eaves structure may include an eaves portion disposed over the support pattern, and a pillar portion protruding from the lower surface of the eaves portion and contacting the upper surface of the auxiliary power electrode through the support pattern, the support pattern may include a lower surface having a first width, an upper surface having a second width which is narrower than the first width, and an inclined surface between the lower surface and the upper surface, the width of the eaves portion may be wider than the first width.

The light emitting display device according to an embodiment of the present disclosure may include a circuit layer having a thin film transistor and an auxiliary power electrode over a substrate, a first protective layer overlaying the circuit layer, a second protective layer disposed over the first protective layer, a contact portion configured to expose a portion of the auxiliary power electrode, an eaves structure disposed over a portion of the auxiliary power electrode and configured to have an undercut region, a support pattern between a portion of the auxiliary power electrode and the eaves structure, a pixel electrode disposed over the second protective layer and connected to the thin film transistor, a light emitting layer disposed over the pixel electrode, and a common electrode disposed over the light emitting layer and connected to the auxiliary power electrode in the undercut region of the eaves structure.

In the light emitting display device according to an embodiment of the present disclosure, the support pattern may be made of the same material as that of the first protective layer, and the eaves structure may be made of different material from the support pattern.

Accordingly, the light emitting display device according to the present disclosure may reduce defects generated during a manufacturing process by forming the undercut shape with high peeling resistance in the cathode contact region, thereby enabling mass production and improving reliability of the light emitting display device.

It will be apparent to those skilled in the art that various modifications and variations can be made in the light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display device comprising:
a circuit layer having a thin film transistor and an auxiliary power electrode over a substrate;
a protective layer overlaying the circuit layer;
a contact portion configured to expose a portion of the auxiliary power electrode;
an eaves structure disposed over a portion of the auxiliary power electrode and configured to have an undercut region, the eaves structure including a pillar portion over the auxiliary power electrode and an eaves portion on the pillar portion, wherein the eaves portion has a greater width than the pillar portion to define the undercut region;
a pixel electrode disposed over the protective layer and connected to the thin film transistor;
a light emitting layer disposed over the pixel electrode;
a common electrode disposed over the light emitting layer and connected to the auxiliary power electrode in the undercut region of the eaves structure; and
a support pattern between a portion of the auxiliary power electrode and the eaves structure,
wherein the eaves structure, including the pillar portion and the eaves portion, is made of a single material, and
wherein a lower surface of the eaves portion is in contact with an upper surface of the support pattern, and a side surface of the pillar portion is in contact with a side surface of the support pattern, and
wherein the pillar portion is in contact with an upper surface of the auxiliary power electrode.

2. The light emitting display device according to claim 1, wherein the undercut region corresponds to a lower portion of the eaves portion.

3. The light emitting display device according to claim 2, wherein the pillar portion includes an inclined surface having a reverse tapered shape whose upper width that protrudes from the lower surface of the eaves portion is wider than its lower width that contacts the upper surface of the auxiliary power electrode.

4. The light emitting display device according to claim 2, wherein the eaves structure is formed in an island pattern over a portion of the auxiliary power electrode, and the portion of the auxiliary power electrode exposed by the contact portion includes an exposed portion of the auxiliary power electrode in the periphery of the eaves structure.

5. The light emitting display device according to claim 4, wherein the eaves portion overlaps at least a portion of the exposed portion of the auxiliary power electrode.

6. The light emitting display device according to claim 1, wherein the eaves structure and the support pattern are made of different materials from each other.

7. The light emitting display device according to claim 1, wherein the undercut region includes a lower portion of the eaves portion and a lateral surface of the pillar portion.

8. The light emitting display device according to claim 7, wherein the support pattern includes a lower surface having a first width, an upper surface having a second width which is narrower than the first width, and an inclined surface between the lower surface and the upper surface, and wherein the width of the eaves portion is wider than the first width.

9. The light emitting display device according to claim 1, wherein the lower surface of the eaves portion is in direct contact with the upper surface of the support pattern, wherein the side surface of the pillar portion is in direct contact with the side surface of the support pattern, and wherein the pillar portion is in direct contact with the upper surface of the auxiliary power electrode.

10. A light emitting display device comprising:

a circuit layer having a thin film transistor and an auxiliary power electrode over a substrate;

a first protective layer overlaying the circuit layer;

a second protective layer disposed over the first protective layer;

a pixel electrode disposed over the second protective layer and connected to the thin film transistor;

a bank layer disposed over the second protective layer and configured to define an opening at the pixel electrode;

a contact portion which penetrates the first and second protective layers and the bank layer to expose a portion of the auxiliary power electrode;

an eaves structure disposed over a portion of the auxiliary power electrode exposed by the contact portion and configured to include an undercut region, the eaves structure including a pillar portion over the auxiliary power electrode and an eaves portion on the pillar portion, wherein the eaves portion has a greater width than the pillar portion to define the undercut region;

a light emitting layer disposed over the pixel electrode and the bank layer; and a common electrode disposed over the light emitting layer and connected to the auxiliary power electrode in the undercut region of the eaves structure; and a support pattern between a portion of the auxiliary power electrode and the eaves structure, wherein a lower surface of the eaves portion is in contact with an upper surface of the support pattern, and a side surface of the pillar portion is in contact with a side surface of the support pattern, and wherein the pillar portion is in contact with an upper surface of the auxiliary power electrode.

11. The light emitting display device according to claim 10, wherein a lower surface of the eaves portion is in direct contact with an upper surface of the support pattern, wherein a side surface of the pillar portion is in direct contact with a side surface of the support pattern, and wherein the pillar portion is in direct contact with an upper surface of the auxiliary power electrode.

12. The light emitting display device according to claim 10, wherein the lower surface of the eaves portion is in direct contact with the upper surface of the support pattern, wherein the side surface of the pillar portion is in direct contact with the side surface of the support pattern, and wherein the pillar portion is in direct contact with the upper surface of the auxiliary power electrode.

13. The light emitting display device according to claim 10, wherein the first protective layer is made of an inorganic insulating material, and the second protective layer is made of an organic insulating material.

14. The light emitting display device according to claim 10, wherein the undercut region of the eaves structure is formed at the same layer as the first protective layer.

15. The light emitting display device according to claim 14, wherein the eaves structure is made of the same material as that at least one of the bank layer, the second protective layer, and or the pixel electrode.

16. The light emitting display device according to claim 14, wherein a height of the pillar portion is lower than or equal to a height of the first protective layer.

17. The light emitting display device according to claim 16, wherein the pillar portion includes an inclined surface having a reverse tapered shape whose upper width that protrudes from the lower surface of the eaves portion is wider than its lower width that contacts the upper surface of the auxiliary power electrode.

18. The light emitting display device according to claim 10, wherein the support pattern is made of the same material as that of the first protective layer.

19. The light emitting display device according to claim 10, wherein the the support pattern includes a lower surface having a first width, the upper surface having a second width which is narrower than the first width, and an inclined surface between the lower surface and the upper surface, and wherein the width of the eaves portion is wider than the first width.

20. A light emitting display device comprising:

a circuit layer having a thin film transistor and an auxiliary power electrode over a substrate;

a first protective layer overlaying the circuit layer;

a second protective layer disposed over the first protective layer;

a contact portion configured to expose a portion of the auxiliary power electrode;

an eaves structure disposed over a portion of the auxiliary power electrode and configured to have an undercut region, the eaves structure including a pillar portion over the auxiliary power electrode and an eaves portion on the pillar portion, wherein the eaves portion has a greater width than the pillar portion to define the undercut region;

a support pattern between a portion of the auxiliary power electrode and the eaves structure;

a pixel electrode disposed over the second protective layer and connected to the thin film transistor;

a light emitting layer disposed over the pixel electrode; and a common electrode disposed over the light emitting layer and connected to the auxiliary power electrode in the undercut region of the eaves structure, wherein the pillar portion and the eaves portion are formed of the same material as the second protective layer, and wherein the support pattern is formed of a same insulating material as the first protective layer.

* * * * *